(12) United States Patent
Kashiwabara et al.

(10) Patent No.: US 8,232,719 B2
(45) Date of Patent: Jul. 31, 2012

(54) ORGANIC ELECTROLUMINESCENCE DISPLAY DEVICE

(75) Inventors: Mitsuhiro Kashiwabara, Kanagawa (JP); Jiro Yamada, Kanagawa (JP); Hiroshi Fujimaki, Tokyo (JP); Hirofumi Fujioka, Kanagawa (JP); Reo Asaki, Tokyo (JP)

(73) Assignee: Sony Corporation, Tokyo (JP)

( * ) Notice: Subject to any disclaimer, the term of this patent is extended or adjusted under 35 U.S.C. 154(b) by 15 days.

(21) Appl. No.: 12/902,778

(22) Filed: Oct. 12, 2010

(65) Prior Publication Data

US 2011/0027616 A1    Feb. 3, 2011

Related U.S. Application Data

(63) Continuation of application No. 12/114,606, filed on May 2, 2008, now Pat. No. 7,915,816.

(30) Foreign Application Priority Data

May 14, 2007 (JP) .................. 2007-127805
Feb. 19, 2008 (JP) .................. 2008-037190

(51) Int. Cl.
*H01L 51/00* (2006.01)
*H01L 51/50* (2006.01)
(52) U.S. Cl. ............... 313/504; 313/503; 313/505
(58) Field of Classification Search .......... 313/498–512
See application file for complete search history.

(56) References Cited

U.S. PATENT DOCUMENTS

| 7,224,115 | B2 | 5/2007 | Sato et al. |
| 7,265,391 | B2 | 9/2007 | Yamazaki et al. |
| 2001/0043046 | A1 | 11/2001 | Fukunaga |
| 2002/0011783 | A1 | 1/2002 | Hosokawa |
| 2002/0158835 | A1 | 10/2002 | Kobayashi et al. |
| 2003/0201708 | A1 | 10/2003 | Yamada et al. |
| 2003/0222575 | A1 | 12/2003 | Yamazaki et al. |
| 2004/0003939 | A1 | 1/2004 | Nishi et al. |
| 2004/0056591 | A1 | 3/2004 | Koo et al. |
| 2004/0160170 | A1 | 8/2004 | Sato et al. |
| 2005/0001546 | A1 | 1/2005 | Yamaguchi |
| 2005/0007015 | A1 | 1/2005 | Yokoyama et al. |

(Continued)

FOREIGN PATENT DOCUMENTS

JP    2001-195008    7/2001

(Continued)

OTHER PUBLICATIONS

Japanese Patent Office, Office Action, issued in connection with Japanese Patent Application No. 2009-121546, issued on Oct. 18, 2011, (3 pages).

*Primary Examiner* — Joseph L Williams
(74) *Attorney, Agent, or Firm* — K&L Gates LLP

(57) ABSTRACT

An organic electroluminescence display device is provided. The organic electroluminescence display device includes plural organic electroluminescence elements. Each organic electroluminescence element includes: a lower electrode; an insulating layer having an opening, in which a lower electrode is exposed at the bottom of the opening; an auxiliary wiring; a stacked structure provided from a portion over the lower electrode exposed at the bottom of the opening to a portion of the insulating layer surrounding the opening, including a light emitting layer made of an organic light-emitting material; and an upper electrode. At least one layer of the stacked structure partially contacts the auxiliary wiring. The insulating layer and the auxiliary wiring are provided in common to the plurality of organic EL elements. The upper electrode covers the whole surface of the stacked structures and the auxiliary wiring.

8 Claims, 14 Drawing Sheets

U.S. PATENT DOCUMENTS

| | | |
|---|---|---|
| 2005/0077814 A1 | 4/2005 | Koo et al. |
| 2005/0077816 A1 | 4/2005 | Yamada et al. |
| 2005/0253508 A1 | 11/2005 | Okano |
| 2007/0063645 A1 | 3/2007 | Yokoyama |
| 2007/0066178 A1 | 3/2007 | Yamada et al. |
| 2007/0257602 A1 | 11/2007 | Miyagi et al. |

FOREIGN PATENT DOCUMENTS

| | | |
|---|---|---|
| JP | 2004-207217 | 7/2004 |
| JP | 2004-335389 | 11/2004 |
| JP | 2005-038833 | 2/2005 |
| JP | 2005-093398 | 4/2005 |
| JP | 2006-156267 | 6/2006 |
| JP | 2007-073323 | 3/2007 |

ORGANIC ELECTROLUMINESCENCE DISPLAY DEVICE

CROSS REFERENCE TO RELATED APPLICATIONS

The present application is a continuation of U.S. application Ser. No. 12/114,606 filed May 2, 2008, which claims priority to Japanese Patent Application JP 2007-127805 filed on May 14, 2007 and Japanese Patent Application JP 2008-037190 filed on Feb. 19, 2008, respectively, the entire contents of which are being incorporated herein by reference.

BACKGROUND

The present disclosure relates to an organic electroluminescence display device.

In an organic electroluminescence element (abbreviated to an organic EL element) forming an organic electroluminescence display device (abbreviated to an organic EL display device) which uses electroluminescence (hereinafter, abbreviated to EL) as an organic material, a stacked structure formed by stacking an organic hole transport layer, an organic light-emitting layer and the like is provided between a lower electrode and an upper electrode, on which attention is focused as a light-emitting element capable of emitting light at high luminance by low-voltage DC driving.

Since the above organic EL element has a response speed of 1 microsecond or less, duty driving by a passive matrix system is possible in the organic EL display device. However, when the duty ratio becomes higher with the increase of the number of pixels, it is necessary to supply large electric current instantaneously to the organic EL element in order to secure sufficient luminance, which tends to cause damage to the organic the organic EL element.

On the other hand, in an active matrix drive system, signal voltage is held by forming a storage capacitor as well as a thin-film transistor (hereinafter, abbreviated to TFT) at each sub-pixel. Therefore, it is possible to constantly supply drive current according to the signal voltage to the organic EL element during a desired period in one display frame. Accordingly, it is not necessary to supply instantaneously large current to the organic EL element such as in the passive matrix system, which reduces damage to the organic EL element. Note that one pixel usually includes three kinds of sub pixels which are a red light-emitting sub pixel emitting red color, a green light-emitting sub pixel emitting green color and a blue light-emitting sub pixel emitting blue color.

In the above organic EL display device of the active matrix drive system, as showing schematic partial cross-sectional view in FIG. 13 and showing schematic partial plan view in FIG. 14, a TFT is provided on a first substrate 11 so as to correspond to each sub pixel, and these TFTs are covered by an interlayer insulating layer 16 (a lower interlayer insulating layer 16A and an upper interlayer insulating layer 16B). A lower electrode 121 which is electrically connected to the TFT is provided on the upper layer interlayer insulating layer 16B by each sub pixel. An insulating layer 124 is further formed on the upper interlayer insulating layer 16B including the lower electrode 121, and an opening 126 in which the lower electrode is exposed at the bottom thereof is provided in the insulating layer 124. A stacked structure 123 is provided at a portion from a portion over the lower electrode 121 exposed at the bottom of the opening 126 to a portion 124' of the insulating layer 124 surrounding the opening 126, which includes a light emitting layer made of an organic light-emitting material. An upper electrode 122 as a common electrode is formed on the insulating layer 124 including the stacked structure 123. A reference numeral 12 denotes a gate electrode included in the TFT, a reference numeral 13 denotes a gate insulating film included in the TFT, a reference numeral 14 denotes a source/drain region included in the TFT, a reference number 15 is a channel formation region included in the TFT, a reference numeral 17 denotes a wiring, a reference numeral 31 denotes a protection film, a reference numeral 32 denotes an adhesive layer, and a reference number 33 denotes a second substrate, which will be described in detail in Embodiment 1.

Since the stacked structures 123 are formed over the first substrate 11 on which the TFTs are formed through the interlayer insulating layer 16, in the case of an organic EL display device of a so-called bottom surface emitting type in which emitted light generated at the stacked structures 123 is taken out from the side of the first substrate, taken-out regions of the emitted light are narrowed by the TFTs. Therefore, it is desirable to apply an organic EL display device of a so-called top-surface emitting type in which emitted light is taken out from the second substrate 33 opposite to the first substrate 11.

In case that the organic EL display device of the top-surface emitting type is applied, the lower electrode 121 is usually made of a reflection material and the upper electrode 122 is made of a transparent conductive material or a semitransparent conductive material. However, the transparent material such as an oxide of indium and tin (ITO) or an oxide of indium and zinc (IZO), and the semitransparent material including a thin-film metal have a higher electric resistance value as compared with metals and the like. Therefore, a voltage gradient occurs in the upper electrode 122 as the common electrode, as a result, voltage tends to fall. When such voltage falling occurs, voltage to be applied to the stacked structure 123 forming each sub pixel will be uneven, which significantly reduces the display performance such that light emitting intensity at, for example, the central portion of a display area of the organic EL display device is reduced.

A means for addressing the above problems is well known in, for example, JP-A-2001-195008, or JP-A-2004-207217. In the technique disclosed in these patent documents, an auxiliary wiring 125 which is divided from the stacked structure 123 by the insulating layer 124 is provided, and the upper electrode 122 is formed from a portion over the stacked structure 123 to a portion over the auxiliary wiring 125 through the insulating layer 124. The auxiliary wiring 125 is made of a conductive material having a low electric resistance value such as metals.

The insulating layer 124 is often made of an organic material. After the insulating layer 124 having the opening 126 is formed over the insulating layer 16, plasma treatment using oxygen radical and the like is performed for cleaning up the surface of the lower electrode 121 exposed at the bottom of the opening 126. Organic matters and the like on the surface of the lower electrode 121 exposed at the bottom of the opening 126 are removed by performing the plasma treatment. However, as the result of performing the plasma treatment, the surface of the insulation layer 124 is also activated. For example, the insulating layer 124 includes a polyimide resin, a contact angle between the insulating layer 124 and water when the oxygen plasma treatment is not performed is approximately 78 degrees, however, the contact angle between the insulating layer 124 and water after the oxygen plasma treatment is performed is approximately 22 degrees.

To provide the auxiliary wiring 125 is useful because it prevents image quality from being lowered due to the voltage falling of the upper electrode 122. However, when the upper layer 124 is in the activated state as described above, particularly in case that the upper electrode is made of a semitransparent conductive material including a thin-film metal, a portion of the upper electrode 122 (non-overlapping portion 122') on the insulating layer 124 connecting a portion of the upper electrode 122 on the stacked structure 123 to a portion of the upper electrode 122 on the auxiliary wiring 125 is degenerated when forming the upper electrode 122 after the stacked structure 123 is formed, which significantly lowers the conductivity. As a consequence, image quality deteriorates.

Thus, it is desirable to provide an organic EL display device having excellent display performance, including a configuration and a structure capable of reliably preventing the degeneration of the portion of the upper electrode connecting the portion of the upper electrode on the stacked structure to the portion of the upper electrode on the auxiliary wiring.

SUMMARY

According to a first embodiment, there is provided an organic electroluminescence display device (abbreviated to an organic EL display device according to the first embodiment) including plural organic electroluminescence elements (abbreviated to organic EL elements), each having (A) a lower electrode, (B) an insulating layer having an opening, in which a lower electrode is exposed at the bottom of the opening, (C) an auxiliary wiring, (D) a stacked structure provided from a portion over the lower electrode exposed at the bottom of the opening to a portion of the insulating layer surrounding the opening, including a light emitting layer made of an organic light-emitting material, and (E) an upper electrode, in which at least one layer of the stacked structure partially contacts the auxiliary wiring, the insulating layer and the auxiliary wiring are provided in common to the plural organic EL elements, and the upper electrode covers the whole surface of the stacked structures and the auxiliary wiring forming the plural organic EL elements.

In the organic EL display device according to the first embodiment, a portion (overlapping portion) of at least one layer of the stacked structure which contacts the auxiliary wiring may be formed on the auxiliary wiring (more specifically, on an edge portion of the auxiliary wiring). In the organic EL display device according to the first embodiment including such preferred state, the stacked structure may be configured to touch the two auxiliary wirings, (specifically, to overlap with edge portions of the two auxiliary wirings extending in parallel and sandwiching the stacked structure), though not limited thereto.

According to a second embodiment, there is provided an organic electroluminescence display device (abbreviated to an organic EL display device according to the second embodiment) including plural organic electroluminescence elements, each having (A) a lower electrode, (B) an insulating layer having an opening, in which a lower electrode is exposed at the bottom of the opening, (C) an auxiliary wiring, (D) a stacked structure provided from a portion over the lower electrode exposed at the bottom of the opening to a portion of the insulating layer surrounding the opening, including a light emitting layer made of an organic light-emitting material, and (E) an upper electrode, in which a portion of the upper electrode positioned over the auxiliary wiring is electrically connected to the auxiliary wiring through a two-layer structure layer including a charge injection layer and a charge transport layer from below, the insulating layer and the auxiliary wiring are provided in common to plural organic EL elements, and the upper electrode covers the stacked structures and the two-layer structure layer forming the plural organic EL elements without touching the insulating layer.

In the organic EL display device according to the second embodiment, the two-layer structure layer extends between the upper electrode and the insulating layer and further, the two-layer structure layer extends also between the stacked structure positioned over the lower electrode and the upper electrode. In case that the two-layer structure layer extends between the stacked structure and the upper electrode, specifically, the two-layer structure layer and the upper electrode formed thereon cover the stacked structures forming the plural organic electroluminescence elements. In this case, the two-layer structure layer and the upper electrode formed thereon can be formed by the same process, which can simplify the manufacturing process as well as reduces the number of masks to be used. In addition, in the organic EL display device according to the second embodiment, at least one layer of the stacked structure may include a portion touching the auxiliary wiring.

In the organic EL display device according to the second embodiment including the above preferred state, it is preferable that voltage falling between the auxiliary wiring and the upper electrode is equal to or less than 5 V when the current density of electric current flowing at a contact portion between the auxiliary wiring and the upper electrode is equal to or less than 10 A/cm$^2$. Such preferred state can be achieved by the suitable selection of materials forming the two-layer structure layer and the optimization of the area of the portion of the two-layer structure layer which electrically connects the upper electrode and the auxiliary wiring.

Furthermore, in the organic EL display device according to the first embodiment or the second embodiment including the preferred states explained as the above, the upper electrode is configured to be made of a conductive material including magnesium (Mg), for example, a Mg—Ag alloy, and the thickness of the upper electrode is configured to be 4 nm to 20 nm, preferably, 6 nm to 12 nm.

In the organic EL display device according to the first embodiment or the second embodiment (hereinafter, sometimes simply referred to as the present application) including the preferred configuration or the state explained as the above, when the organic EL display device is a color-display organic EL display device, respective organic EL elements forming the organic EL display device form sub pixels. One pixel includes three kinds of sub pixels which are a red light-emitting sub pixel emitting red, a green light-emitting sub pixel emitting green and a blue light-emitting sub pixel emitting blue. Therefore, in this case, when the number of organic EL elements forming the organic EL display device is N×M, the number of pixels is (N×M)/3.

In the organic EL display device according to the first embodiment, the upper electrode covers the whole surface of the stacked structures and the auxiliary wiring forming the plural organic EL elements, and specifically, it is preferable that the stacked structures and the auxiliary wiring forming N×M (namely, all) organic El elements are covered by one sheet of upper electrode, though not limited thereto. In the organic EL display device according to the second embodiment, the upper electrode covers the stacked structures forming plural organic EL display elements, and specifically, it is preferable that the stacked structures forming N×M (namely, all) organic EL elements are covered by one sheet of upper electrode, though not limited thereto. In this case, it is more preferable that the stacked structures forming N×M (namely, all) organic EL elements are covered by one sheet of two-layer structure layer.

In the organic EL display device according to the second embodiment, when the lower electrode is used as an anode electrode and the upper electrode is used as a cathode electrode, the charge injection layer included in the two-layer structure layer is formed by an electron injection layer and the charge transport layer is formed by an electron transport layer. On the other hand, when the lower electrode is used as a cathode electrode and the upper electrode is used as an anode electrode, the charge injection layer included in the two-layer structure layer is formed by a hole injection layer and the charge transport layer is formed by a hole transport layer. Materials forming these respective layers are configured to be the same known materials forming the electron injection layer, the electron transport layer, the hole injection layer and the hole transport layer, and as an example, LiF can be cited as a material forming the electron injection layer, and electron transport materials such as Bathophenanthroline, Bathocuproine (BCP) and Anthracene as materials forming the electron transport layer. Materials forming these respective layers may be the same as materials forming a layer having the same function in the stacked structure or may be different from them. It is preferable that the two-layer structure layer is formed based on a vacuum deposition process which is a process in which energy of deposition particles is small to an extent not affecting the stacked structure.

In the embodiment, when the organic EL display device is a top-surface emitting type and the lower electrode is used as the anode electrode, it is preferable that the lower electrode is made of a conductive material whose value of a work function is large as well as whose light reflectance is high such as chromium (Cr), iron (Fe), cobalt (Co), nickel (Ni), copper (Cu), tantalum (Ta), tungsten (W), platinum (Pt) and gold (au). In addition, when a conductive material whose value of the work function is small as well as whose light reflectance is high such as aluminum (Al), or alloys including aluminum is used, the lower electrode can be used as the anode electrode by providing a suitable hole injection layer to improve the hole injection ability. It is also preferable to apply a structure in which a transparent conductive material having excellent hole injection characteristics such as oxide of indium and tin (ITO) or oxide of indium and zinc (IZO) is stacked on a conductive material having high light reflectance. On the other hand, when the lower electrode is used as the cathode electrode, it is preferable that the lower electrode is made of a conductive material whose value of the work function is small as well as whose light reflectance is high, however, the lower electrode can be used as the cathode electrode by providing a suitable electron injection layer to a conductive material having high light reflectance used as the anode electrode to improve the electron injection ability. As a method of forming the lower electrode, a vapor deposition process such as an electron beam deposition process, and a hot-filament deposition process, a sputtering process, a chemical vapor deposition process (CVD process), the combination of an ion-plating process and an etching process; various printing processes such as a screen printing process, an ink jet printing process and a metal mask printing process; a plating process (an electroplating or an electroless plating process); a lift-off process; a laser ablation process; a Sol-Gel process and the like can be cited.

On the other hand, when the organic EL display device is the top-surface emitting type and the upper electrode is used as the cathode electrode, it is preferable that the upper electrode is made of a conductive material whose value of the work function is small so as to allow emitted light to be transmitted therethrough as well as to allow electrons to be efficiently injected with respect to the stacked structure. Specifically, it is preferable to use a conductive film as the upper electrode, which has high light transmittance such as a Mg—Ag alloy thin film (for example, a metal or an alloy material whose light transmittance is 30% or more) as described above. Note that the upper electrode is liable not to function as an electrode if the thickness of the upper electrode made of the Mg—Au alloy is not more than 4 nm. If the thickness exceeds 20 nm, the electrode is liable not to be suitable for the upper electrode because the light transmittance is reduced. When the upper electrode is used as the anode electrode, it is preferable that the upper electrode is made of a conductive material through which emitted light is transmitted and whose value of the work function is large. The upper electrode is preferably formed by a deposition process which is a process in which energy of deposition particles is small such as the vacuum deposition process or a MOCVD process from a viewpoint that damages in the stacked structure is prevented from occurring. If damages occur in the stacked structure, a non-emitting pixel (or non-emitting sub pixel) which is called as a "dark spot" is liable to be generated due to occurrence of leak current. In addition, it is preferable that the formation of the stacked structure to the formation of the upper electrode is executed without being exposed to air from a viewpoint of preventing deterioration of the stacked structure due to moisture in air. When the upper electrode is used as a cathode electrode, an electron injection layer having the same pattern as the upper electrode (for example, made of Lif which is extremely thin, the thickness of which is 0.3 nm) may be formed just under the upper electrode, thereby increasing the electron injection ability, realizing low drive voltage, high efficiency and long life of the organic EL elements.

In an embodiment, it is preferable that the insulating layer is made of an insulating material having excellent flatness and low water-absorbing property for preventing deterioration of the stacked structure due to moisture to keep light-emitting luminance, specifically, organic insulating materials such as polyimide resin, photoresist materials and the like can be cited.

In an embodiment, it is preferable that the auxiliary wiring is made of a conductive material having low resistance, for example, metals such as aluminum (Al), silver (Ag), nickel (Ni), copper (Cu), chromium (Cr), tungsten (W), niobium (Nb), tantalum (Ta), molybdenum (Mo), gold (Au), titanium (Ti), cobalt (Co), zirconium (Zr), iron (Fe), platinum (Pt), and zinc (Zn), or alloys including the above metal elements (for example, Al—Cu). It is possible to form the auxiliary wiring by using the above materials in a single layer or by staking them (for example, a Cr/Cu/Cr stacked film or a Cr/Al/Cr stacked film). As a method of forming the auxiliary wiring, for example, a vapor deposition process such as an electron beam deposition process, and a hot-filament deposition process, a sputtering process, a CVD process, the combination of an ion-plating process and an etching process; various printing processes such as a screen printing process, an ink jet printing process and a metal mask printing process; a plating process (an electroplating or an electroless plating process); a lift-off process; a laser ablation process; a Sol-Gel process and the like can be cited. According to the various printing processes or the plating process, for example, a belt-shape auxiliary wiring or a lattice-shape auxiliary wiring can be directly formed.

According to an embodiment, the stacked structure includes a light-emitting layer made of an organic light-emitting material, specifically being formed by a stacked state of a hole transport layer, a light emitting layer and an electron transport layer, a stacked state of a hole transport layer and a light emitting layer doubling as an electron transport layer, a stacked state of a hole injection layer, a hole transport layer, a light emitting layer, an electron transport layer and an electron injection layer.

Here, in the organic EL display device according to the first embodiment, at least one layer of the stacked structure partially contacts the auxiliary wiring, and it is preferable that a layer having a portion (more specifically, a portion overlapping with an edge portion of the auxiliary wiring) touching the auxiliary wiring (which is called as an "auxiliary wiring contact layer" for convenience) is made to be the above at-least one layer forming the stacked structure. That is to say, when the stacked structure is formed by a stacked state of the hole transport layer, the light emitting layer and the electron transport layer, the auxiliary wiring contact layer can be the hole transport layer, the light emitting layer, the electron transport layer, (the hole transport layer+the light emitting layer), (the light emitting layer+the electron transport layer), (the hole transport layer+the electron transport layer), or (the hole transport layer+the light emitting layer+the electron transport layer). In addition, when the stacked structure is formed by a stacked state of the hole transport layer and the light emitting layer doubling as the electron transport layer, the auxiliary wiring contact layer can be the hole transport layer, the light emitting layer doubling as the electron transport layer or (the hole transport layer+the light emitting layer doubling the electron transport layer). Furthermore, when the stacked structure is formed by a stacked state of the hole injection layer, the hole transport layer, the light emitting layer, the electron transport layer and the electron injection layer, the auxiliary wiring contact layer can be one layer of the five layers, combination of optional two layers of the five layers, combination of optional three layers of the five layers, combination of optional four layers of the five layers or all five layers. Generally, when the stacked structure is formed by a stacked state of L-layers, the auxiliary wiring contact layer can be one layer of the L-layers, all L-layers or combinations of optional layers of two layers or more in the L-layers.

According to an embodiment, as a method of forming the stacked structure or the two-layer structure layer, a physical vapor deposition process (PVD process) such as a vacuum vapor deposition process; printing processes such as a screen printing or an ink jet printing process; a laser transfer process in which the stacked structure or the two-layer structure layer is transferred by irradiating laser to a stacked state of a laser absorption layer formed on a substrate for transfer and the stacked structure or the two-layer structure layer to divide the stacked structure or the two-layer structure layer on the laser absorption layer, and various coating process can be cited. When the stacked structure or the two-layer structure layer is formed based on the vacuum deposition process, for example, a so-called metal mask is used and materials passed through openings provided at the metal mask are deposited to obtain the stacked structure or the two-layer structure layer. In the organic EL display device according to the first embodiment, it is preferable that the length of the opening provided at the metal mask is longer than the interval between points where the stacked structure contacts the auxiliary wiring, for example, when two points of the stacked structure touch the auxiliary wiring, so that portions of the stacked structure which touch the auxiliary wiring are positively formed even when the positional displacement of the metal mask occurs.

The lower electrode included in the organic EL is formed, for example, on the interlayer insulating layer. The interlayer insulating layer covers the organic EL element driver unit formed on the first substrate. The organic EL element driver unit includes one or plural thin-film transistors, and the TFT unit is electrically connected to the lower electrode through a contact plug provided in the interlayer insulating film. As materials for forming the interlayer insulating layer, $SiO^2$ materials such as $SiO^2$, BPSG, PSG, BSG, AsSG, PbSG, SiON, SOG (spin-on-glass), low melting glass, glass paste; SiN materials; or insulating resins such as polyamide can be used by itself or by combining them appropriately. For the formation of the interlayer insulating layer, known processes such as the CVD process, the coating process, the sputtering process, various printing processes can be used.

It is preferable that an insulating or conductive protection film is provided on the upper electrode for preventing moisture from reaching the stacked structure. The protection film is preferably formed based on a deposition process in which energy of deposition particles is small particularly such as a vacuum deposition process, or formed by a MOCVD process, which can reduce effects on the base. It is also preferable that the protection film is deposited by setting deposition temperature to be constant for preventing reduction of luminance due to deterioration of the stacked structure, and further, it is preferably deposited under conditions minimizing the stress on the protection film for preventing the peeling of the protection film. In addition, it is preferable that the protection film is formed without exposing the upper electrode to air, which prevents deterioration of the stacked structure due to moisture or oxygen in air. In case that the organic EL display device is the top-surface emitting type, the protection film is preferably made of a material through which, for example, more than 80% of light generated in the stacked structure is transmitted, specifically, inorganic-amorphous insulating materials such as amorphous silicon ($\alpha$-Si), amorphous silicon carbide ($\alpha$-SiC), amorphous silicon nitride ($\alpha$-$Si_{1-x}$-$N_x$), amorphous silicon oxide ($\alpha$-$Si_{1-y}O_y$), amorphous carbon ($\alpha$-C) can be cited. Since such inorganic-amorphous insulating materials do not generate grains, water permeability is low and can form the good protection film. When the protection film is made of a conductive material, the protection film may be made of a transparent conductive material such as ITO or IZO. The second substrate is arranged over the protection film, and the protection film and the second substrate are adhered by using a UV cure adhesive or a heat cure adhesive.

As materials for the first substrate and the second substrate, high-distortion point glass, soda-lime glass $Na_2O/CaO/SiO_2$), borosilicate glass ($Na_2O/B_2O_3/SiO_2$), forsterite ($2MgO/SiO_2$), lead glass ($Na_2O/PbO/SiO_2$), various plastic substrates can be cited. The material for the first substrate and the material for the second substrate may be the same, or may be different from each other.

In the organic EL display device according to the first embodiment, the stacked structure has a portion (overlapping portion) touching the auxiliary wiring, and the upper electrode covers the whole surface of the stacked structures and the auxiliary wiring forming plural organic EL elements. Therefore, it is certain that there does not exist the insulating layer just under a portion of the upper electrode connecting a portion of the upper electrode over the stacked structure to a portion of the upper electrode over the stacked structure. That is, the portion of the upper electrode connecting the portion of the upper electrode over the stacked structure to the portion of the upper electrode over the auxiliary wiring is formed at least on one layer of the plural layers included in the stacked structure. In the organic EL display device according to the second embodiment, the upper electrode covers the stacked structures and the two-layer structure layer forming plural organic electroluminescence elements without touching the insulating layer. Therefore, a portion of the upper electrode connecting a portion of the upper electrode over the stacked structure and a portion of the upper electrode on the auxiliary wiring does not degenerate, thereby providing the organic EL display device having excellent display performance. In addition, in the organic EL display device according to the second embodiment, the upper electrode and the auxiliary wiring are electrically connected through the two-layer structure layer including a charge injection layer and a charge transport layer from below, therefore, charges (electrons or holes) are transported from the auxiliary wiring to the upper electrode through the charge injection layer and the charge transport layer without losing large voltage, as a result, voltage rising at an electrical connection portion between the upper electrode and the auxiliary wiring can be suppressed as well as manufacturing processes can be simplified according to the state of the two-layer structure layer.

Additional features and advantages are described herein, and will be apparent from the following Detailed Description and the figures.

DETAILED DESCRIPTION

Hereinafter, the embodiments will be explained in embodiments with reference to the drawings.

Embodiment 1

Figure 1:
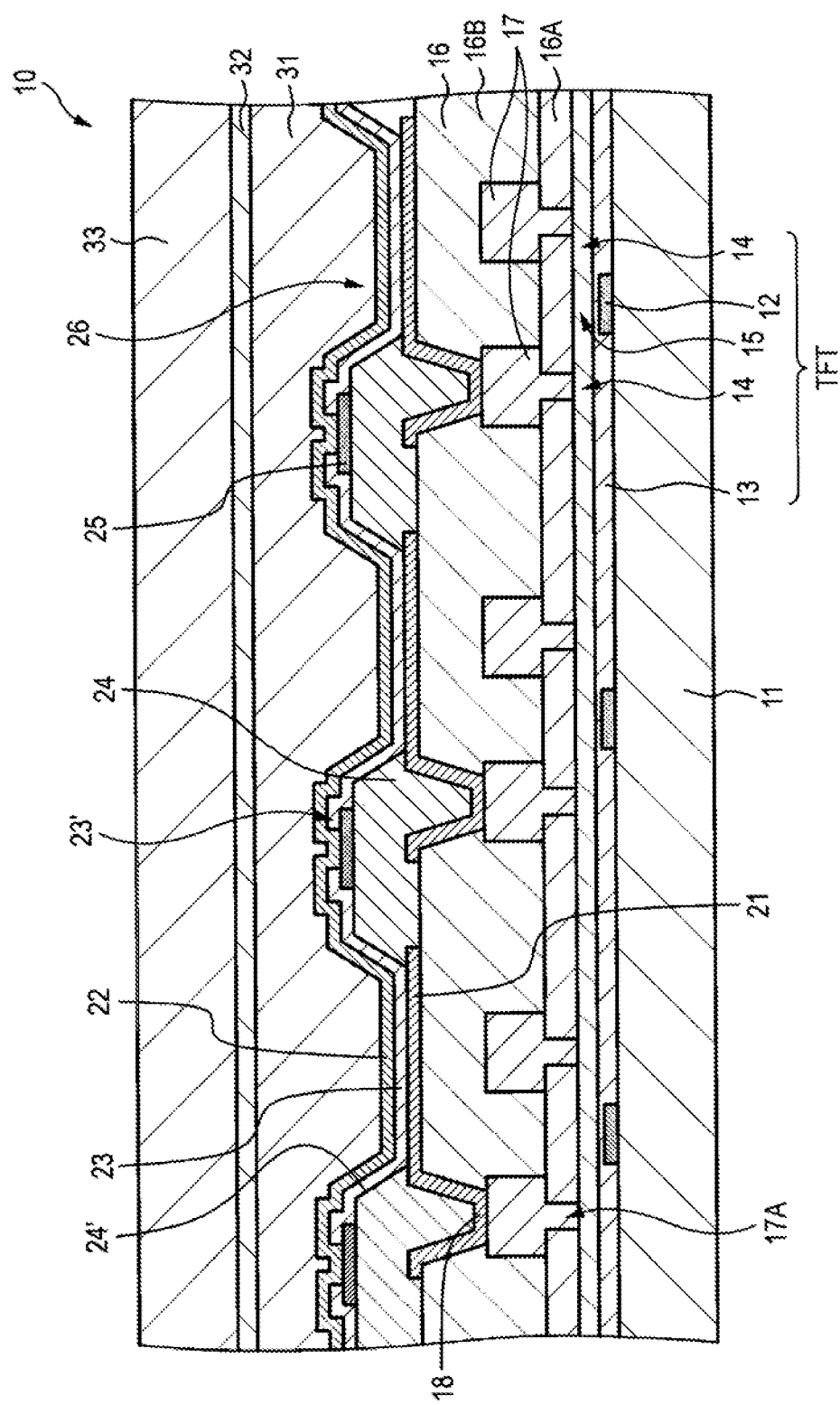
FIG. 1 is a schematic partial cross-sectional view of an organic electroluminescence display device according to Embodiment 1.

Embodiment 1 relates to an organic EL display device according to a first embodiment. A schematic partial cross-sectional view of the organic EL display device of Embodiment 1 is shown in FIG. 1, and an arrangement of a stacked structure, an auxiliary wiring, an insulating layer and the like in the organic EL display device of Embodiment 1 is schematically shown in partial plan views of FIG. 2, FIG. 3 and FIG. 4. The organic EL display device of Embodiment 1 or later-described Embodiment 2 is a color-display organic EL display device of an active matrix type, which is a top-surface emitting type. That is, light is emitted through an upper electrode.

The organic EL display device of Embodiment 1 or later-described Embodiment 2 has plural (for example, N×M=2880×540) organic EL elements 10, 10A. One organic EL element 10, 10A forms one sub pixel. Therefore, the organic EL display device has (N×M)/3 pixels. One pixel includes three kinds of sub pixels which are a red light-emitting sub pixel emitting red color, green light-emitting sub pixel emitting green and a blue light-emitting sub pixel emitting blue color.

Each organic EL element 10, 10A in the organic EL display device of Embodiment 1 or later-described Embodiment 2 includes (A) a lower electrode 21, (B) an insulating layer 24 including an opening 26 in which a lower electrode 21 is exposed at the bottom of the opening 26, (C) an auxiliary wiring 25, 45, (D) a stacked structure 23, 43 provided from a portion over the lower electrode 21 exposed at the bottom of the opening 26 to a portion 24' of the insulating layer 24 surrounding the opening 26, including a light-emitting layer made of an organic light emitting material and (E) an upper electrode 22, 42.

In the organic EL display device of Embodiment 1, at least one layer of the stacked structure 23 (in Embodiment 1, specifically, the whole plural layers forming the stacked structure 23) includes a portion touching the auxiliary wiring 25 (a portion overlapping with an end portion of the auxiliary wiring 25), the insulating layer 24 and the auxiliary wiring 25 are provided in common to plural organic EL elements 10, and the upper electrode 22 covers the whole surface of the stacked structure 23 and the auxiliary wiring 25 forming plural (specifically, N×N pieces) organic EL elements without touching the insulating 24. Here, a portion touching the auxiliary wiring 25 (overlapping portion 23') of at least one layer of the stacked structure 23 (in Embodiment 1, specifically, the whole plural layers forming the stacked structure 23) is formed over an edge portion of the auxiliary wiring 25. The stacked structure 23 contacts two auxiliary wirings 25 extending in parallel and sandwiching the stacked structure 23. More specifically, the stacked structure 23 overlaps with edge portions of two auxiliary wirings 25 extending in parallel and sandwiching the stacked structure 23.

In Embodiment 1, or later-described Embodiment 2, the lower electrode 21 is used as an anode electrode, and the upper electrode 22 is used as a cathode electrode. The lower electrode 21 is made of chromium (Cr) and the upper electrode 22 is made of a conductive material including magnesium (Mg), specifically, a Mg—Ag alloy having a thickness of 10 nm. Note that an average light transmittance of the upper electrode 22 in a range from wavelength 450 nm to 650 nm is 50.3%. The auxiliary wiring 25, 45 is made of a conductive material having low resistance such as aluminum (Al). The lower electrode 21 and the auxiliary wiring 25, 45 are formed based on combination of a vacuum deposition process and an etching process. The upper electrode 22, 42 is deposited particularly by a deposition process in which energy of deposition particles is small such as the vacuum deposition process.

In Embodiment 1, or later-described Embodiment 2, the insulating layer 24 is made of an insulating material having excellent flatness as well as having a low water absorption coefficient for preventing deterioration due to moisture and for maintaining light-emitting luminance in the stacked structure, specifically, a polyimide resin. In addition, the stacked structure 23, 43 is formed by a structure of stacking a hole transport layer and a light-emitting layer doubling as an electron transport layer, or a structure of stacking the hole transport layer, the light-emitting layer and the electron transport layer, however, shown by one layer in the drawing.

In Embodiment 1, or later-described Embodiment 2, the lower electrode 21 included in the organic EL element is provided on an interlayer insulating layer 16 (more specifically, an upper interlayer insulating layer 16B) including $SiO_2$ formed based on a CVD process. The interlayer insulating layer 16 covers an organic EL element driver unit formed on the first substrate 11. The organic EL element driver unit includes plural TFTs, and each TFT and the lower electrode 21 are electrically connected through a contact plug 18, a wiring 17 and a contact plug 17A which are provided in the interlayer insulating layer (more specifically, the upper interlayer insulating layer 16B). In the drawing, one TFT is shown for one organic EL element driver unit.

In Embodiment 1, or later-described Embodiment 2, an insulating protection film 31 including silicon nitride ($Si_{1-x}N_x$) is provided on the upper electrode 22, 42 by using the vacuum deposition process for the purpose of preventing the moisture from reaching the stacked structure 23, 43. A second substrate 33 is arranged over the protection film 31, and the protection film 31 and the second substrate 33 are adhered by an adhesive layer 32 made of a UV cure adhesive.

In Embodiment 1, or later-described Embodiment 2, the first substrate 11 and the second substrate 33 are made of soda-lime glass.

In Embodiment 1, or later-described Embodiment 2, each stacked structure 23, 43 specifically includes a stacked structure 23R in an organic EL element forming a red light-emitting sub pixel, a stacked structure 23G in an organic EL element forming a green light-emitting sub pixel and a stacked structure 23B in an organic EL element forming a blue light-emitting sub pixel.

An outline of a method of manufacturing the organic EL display device of Embodiment 1 will be explained with reference to FIG. 2 to FIG. 4, FIG. 5A to FIG. 5C, FIG. 6A, 6B and FIG. 7A, 7B as follows.

[Process-100]

First, a TFT is fabricated at each sub pixel by a well-known method. The TFT includes a gate electrode 12 formed on the first substrate 11, a gate insulating film 13 formed over the first substrate 11 and the gate electrode 12, source/drain regions 14 provided on a semiconductor layer formed on the gate insulating film 13, and a channel formation region 15 corresponding to a portion between the source/drain regions 14 in the semiconductor layer positioned over the gate electrode 12. In the shown example, the TFT is a bottom-gate type, however, a top-gate type TFT is also preferable. The gate electrode 12 of the TFT is connected to a scanning circuit (not shown). Next, a lower interlayer insulating layer 16A including $SiO_2$ is deposited over the first substrate 11 by the CVD process so as to cover the TFT. Then, an opening 16' is formed in the lower interlayer insulating layer 16A based on a photolithography technique or an etching technique (refer to FIG. 5A).

[Process-110]

Next, the wiring 17 including aluminum is formed on the lower interlayer insulating layer 16A based on combination of the vacuum deposition process and the etching process. The wiring 17 is electrically connected to the source/drain regions 14 of the TFT through the contact plug 17A formed in the opening 16'. The wiring 17 is connected to a signal supply circuit (not shown). Then, the upper inter insulating layer 16B including $SiO_2$ is deposited over the whole surface by the CVD process. Next, an opening 18' is formed over the upper interlayer insulating layer 16B based on the photolithography technique and the etching technique (refer to FIG. 5B).

[Process-120]

Figure 4:
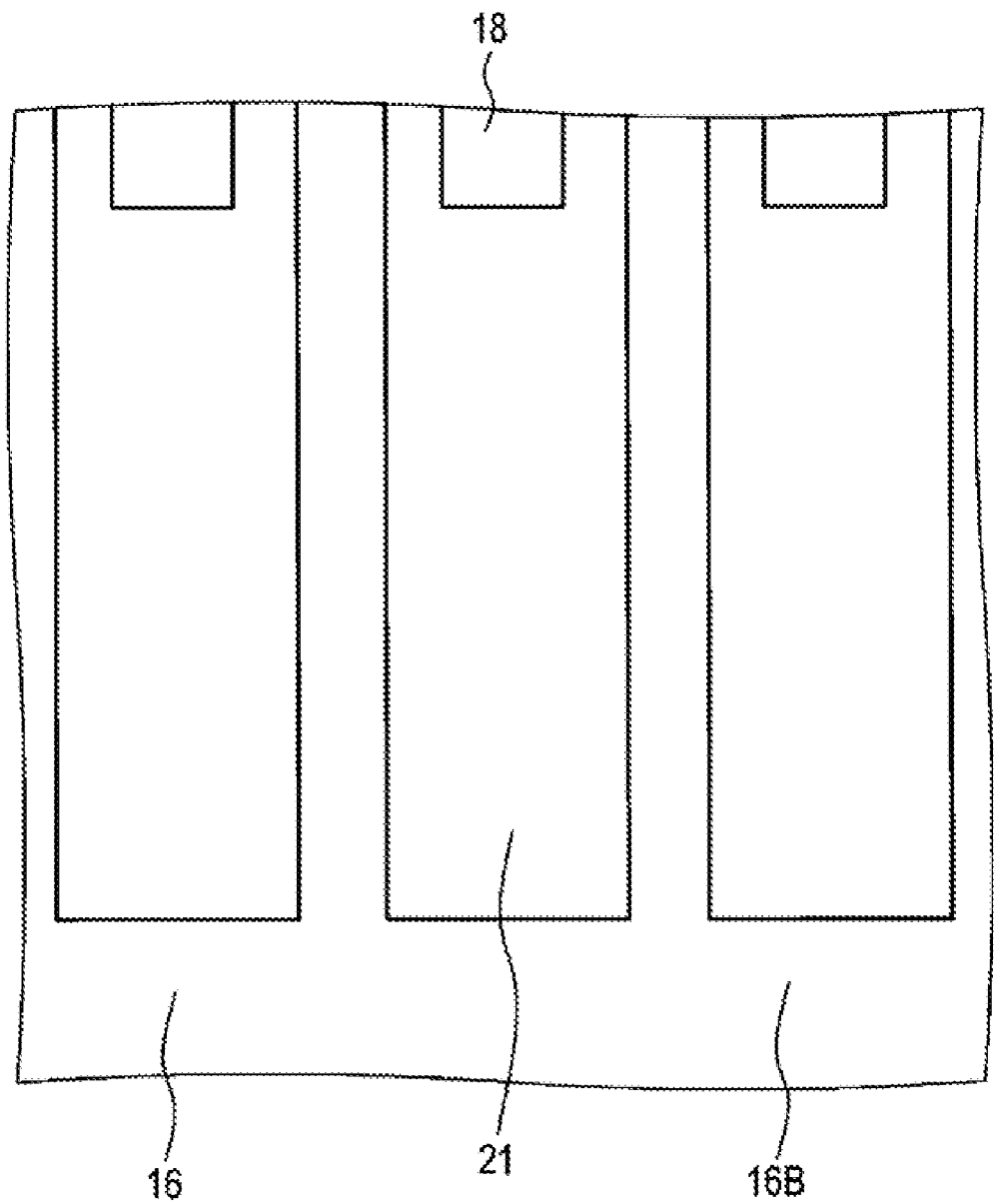
FIG. 4 is a partial plan view schematically showing arrangement of the lower electrode, interlayer insulating layers and the like in the organic electroluminescence display device according to Embodiment 1.
Figure 5A:
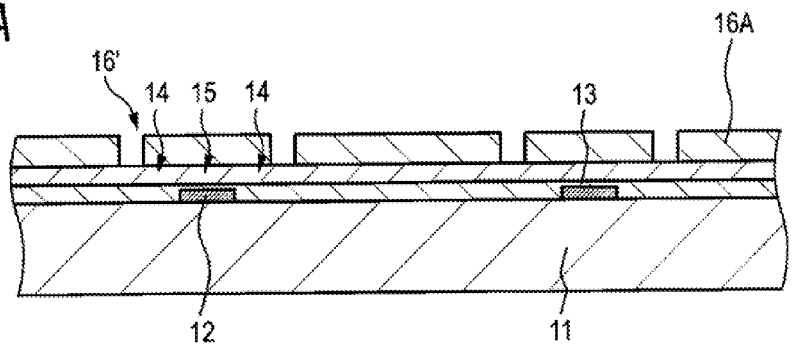
FIG. 5A, FIG. 5B and FIG. 5C are schematic partial cross-sectional views of the first substrate and the like for explaining an outline of a manufacturing method of the organic electroluminescence display device according to Embodiment 1.
Figure 5B:
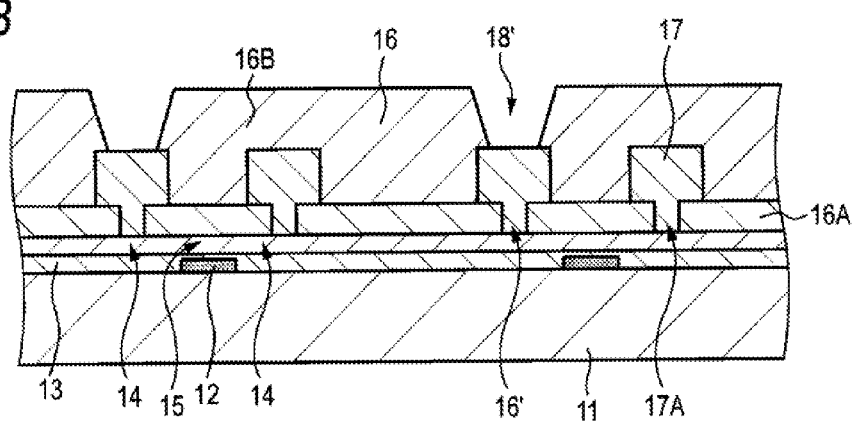
Figure 5C:
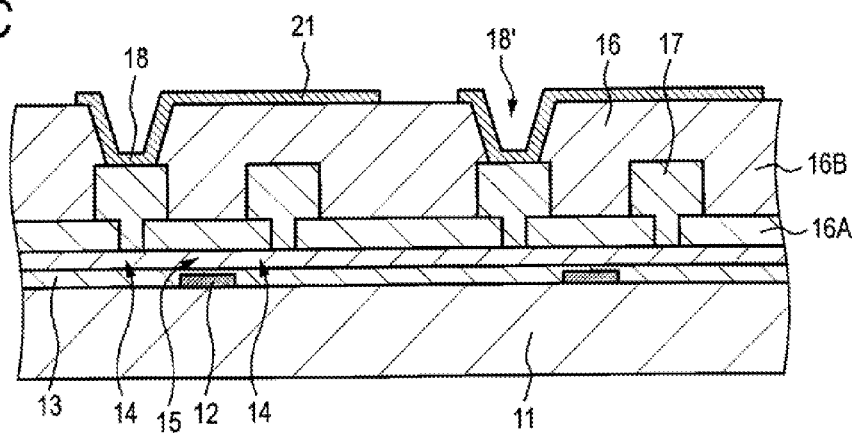

After that, a lower electrode 21 made of chromium is formed on the upper interlayer insulating layer 16B based on combination of the vacuum deposition process and the etching process (refer to FIG. 5C and FIG. 4). The lower electrode 21 is electrically connected to the wiring 17 through the contact plug 18 provided in the opening 18'.

[Process-130]

Figure 3:
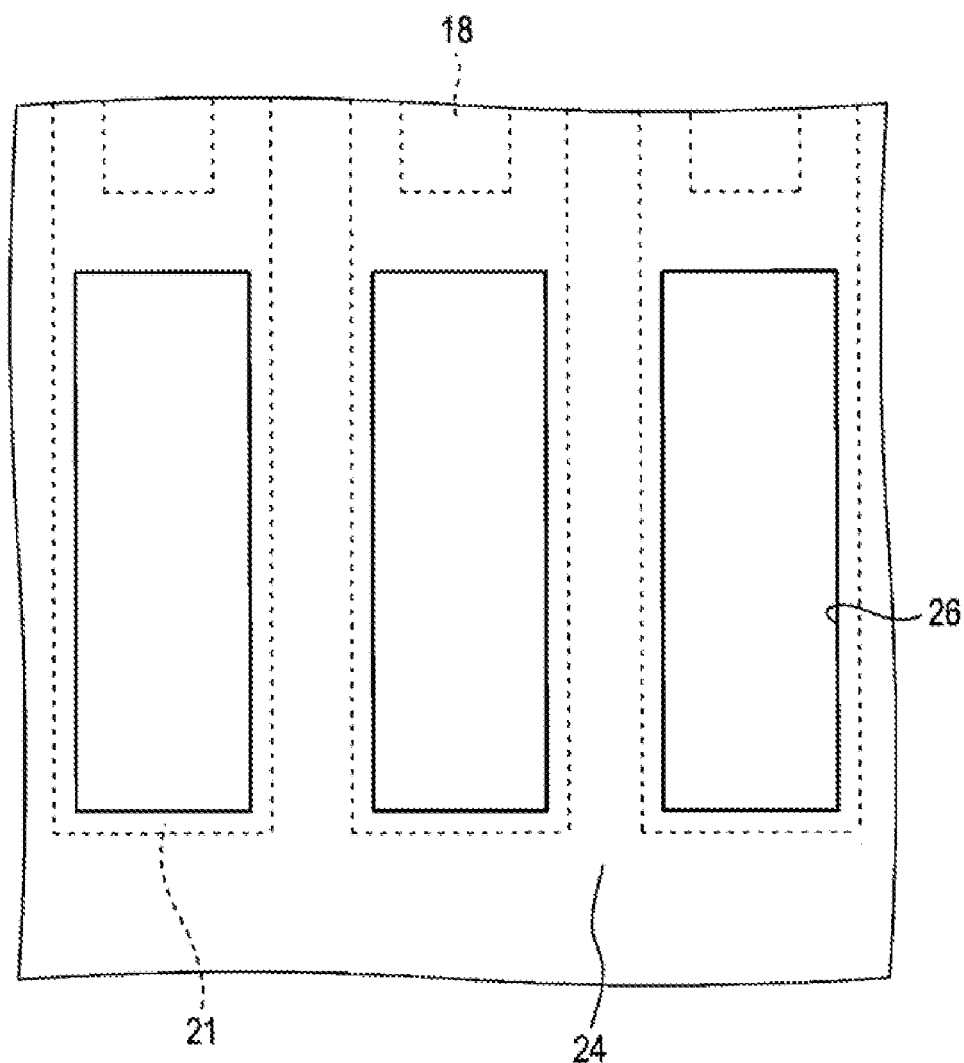
FIG. 3 is a partial plan view schematically showing arrangement of a lower electrode, openings, the insulating layer and the like in the organic electroluminescence display device according to Embodiment 1.
Figure 6A:
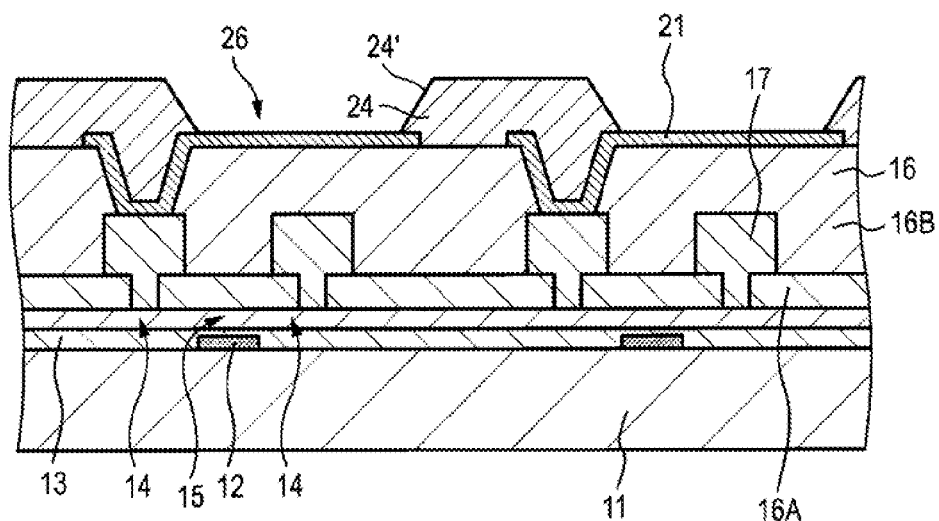
FIG. 6A and FIG. 6B are schematic partial cross-sectional views of the first substrate and the like for explaining the outline of the manufacturing method of the organic electroluminescence display device according to Embodiment 1 continued from FIG. 5C.

Next, an insulating layer 24 having an opening 26, in which the lower electrode 21 is exposed at the bottom of the opening 26 is formed on the interlayer insulating layer 16 including the lower electrode 21 (refer to FIG. 6A and FIG. 3). Specifically, the insulating layer 24 made of polyimide resin having a thickness of 1 μm is formed on the interlayer insulating layer 16 and over the periphery of the lower electrode 21 based on a spin coating process and the etching process. It is preferable that a portion 24' of the insulating layer 24 surrounding the opening 26 forms a gentle slope.

[Process-140]

Figure 6B:
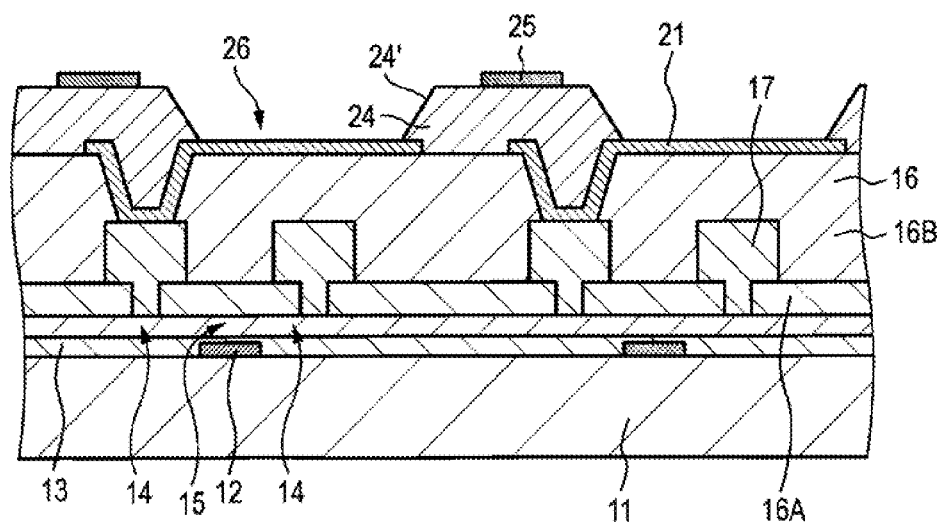

After that, an auxiliary wiring 25 is formed on the insulating layer 24 based on the vacuum deposition process and the etching technique (refer to FIG. 6B). The insulating layer 24 and the auxiliary wiring 25 are provided in common to N×M organic EL elements. The auxiliary wiring 25 is formed on opposed two edges in a kind of protrusion of the insulating layer 24 surrounding the stacked structure 23.

[Process-150]

Figure 2:
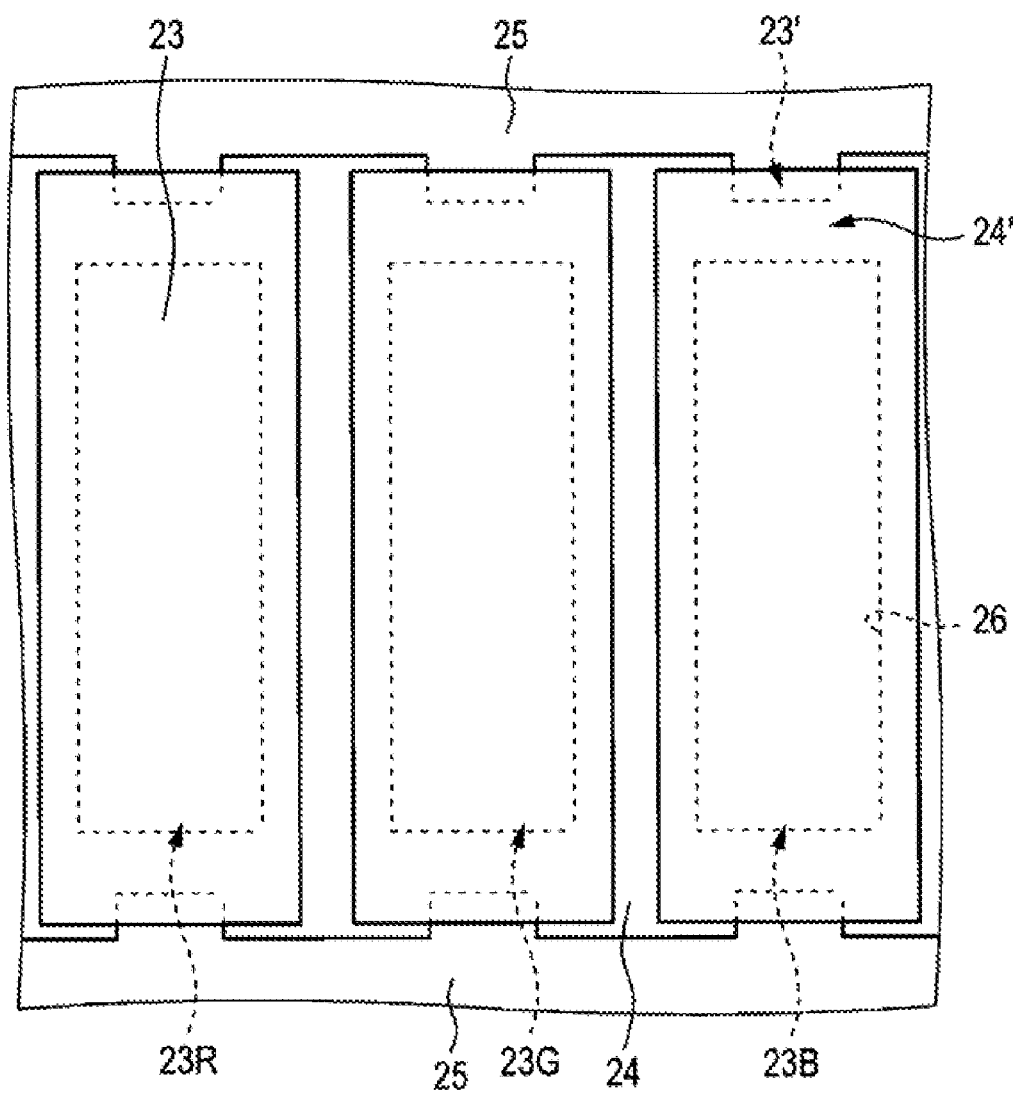
FIG. 2 is a partial plan view schematically showing arrangement of stacked structures, an auxiliary wiring, an insulating layer and the like in the organic electroluminescence display device according to Embodiment 1.
Figure 7A:
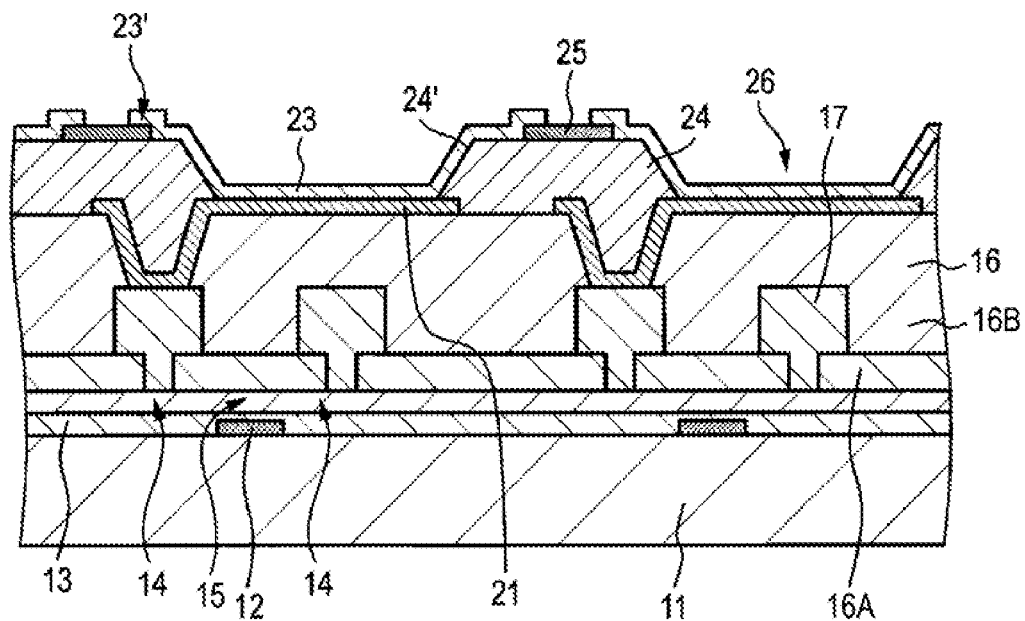
FIG. 7A and FIG. 7B are schematic partial cross-sectional views of the first substrate and the like for explaining the outline of the manufacturing method of the organic electroluminescence display device according to Embodiment 1 continued from FIG. 6B.

Next, a stacked structure 23 is formed from a portion over the lower electrode 21 exposed at the bottom of the opening 26 to the portion 24' of the insulating layer 24 surrounding the opening 26 (refer to FIG. 7A and FIG. 2). In the stacked structure 23, for example, a hole transport layer and a light-emitting layer doubling as an electron transport layer which are made of an organic material are sequentially stacked. Or, in the stacked structure 23, the hole transport layer, the light-emitting layer and the electron transport layer which are made of an organic material are sequentially stacked. The stacked structure 23 contacts the auxiliary wiring 25 as a whole, however, a portion of the stacked structure 23 touching the auxiliary wiring 25 is formed on an edge portion of the auxiliary wiring 25. The stacked structure 23 contacts two auxiliary wirings 25.

Specifically, a plasma treatment is performed for removing organic extraneous matters and for improving hole injection ability of the surface of the lower electrode 21. As gas to be introduced, oxygen gas, nitrogen gas and argon gas can be cited, and in Embodiment 1, oxygen plasma processing of the processing power 100 W and processing time of 180 seconds is performed. The surface of the insulating layer 24 is in a chemically active state by the oxygen plasma processing.

Next, the organic material is vacuum-deposited in a state in which the insulating layer 24 is used as a kind of spacer and a metal mask (not shown) for forming the stacked structure 23 which configures each sub pixel is placed at the protrusion (in which the auxiliary wiring 25 is provided) of the insulating layer 24 based on resistance heating. The organic material passes through an opening provided on the metal mask and is deposited from the portion over the lower electrode 21 exposed at the bottom of the opening 26 forming the sub pixel to the portion 24' of the insulating layer 24 surrounding the opening 26, and further, over a part of the auxiliary wiring 25.

In the stacked structure (organic layer) 23G in the organic EL element forming the green light-emitting pixel, for example, m-MTDATA [4,4',4''-tris(3-methylphenylphenylamino)triphenylamine] is deposited in a film thickness of 25 nm as a hole injection layer. Next, for example, α-NPD[4,4-bis(N-1-naphthyl-N-phenylamino)biphenyl] in a film thickness of 30 nm as a hole transport layer. Subsequently, for example, Alq3 [tris(8-quinolinolato) aluminum (III)] is deposited in a film thickness of 50 nm as the light-emitting layer doubling as the electron transport layer. These layers are sequentially deposited in the same vacuum deposition apparatus.

In the stacked structure (organic layer) 23B in the organic EL element forming the blue light-emitting sub pixel, for example, m-MTDATA is deposited in a film thickness of 18 nm as the hole injection layer. Next, for example, α-NPD is deposited in a film thickness of 30 nm as the light-emitting layer doubling as the hole transport layer. Further, for example, Bathocuproine[2,9-dimethyl-4,7-diphenyl-1,10phenanthroline] is deposited in a film thickness of 14 nm as a hole block layer, then, for example, Alq3 is deposited in a film thickness of 30 nm as the electron transport layer. These layers are sequentially deposited in the same vacuum deposition apparatus.

Furthermore, in the stacked structure (organic layer) 23R in the organic EL element forming the red light-emitting sub pixel, for example, m-MTDATA is deposited in a film thickness of 55 nm as the hole injection layer. Next, for example, α-NPD is deposited in a film thickness of 30 nm as the hole transport layer. Further, for example, BSB-BCN [2,5-bis {(N-methoxyphenyl-N-phenylamino)styryl}benzene-1,4-dicarbonitrile] is deposited as the light emitting layer, then, for example, Alq3 is deposited in a film thickness of 30 nm as the electron transport layer. These layers are sequentially deposited in the same vacuum deposition apparatus.

[Process-160]

Figure 7B:
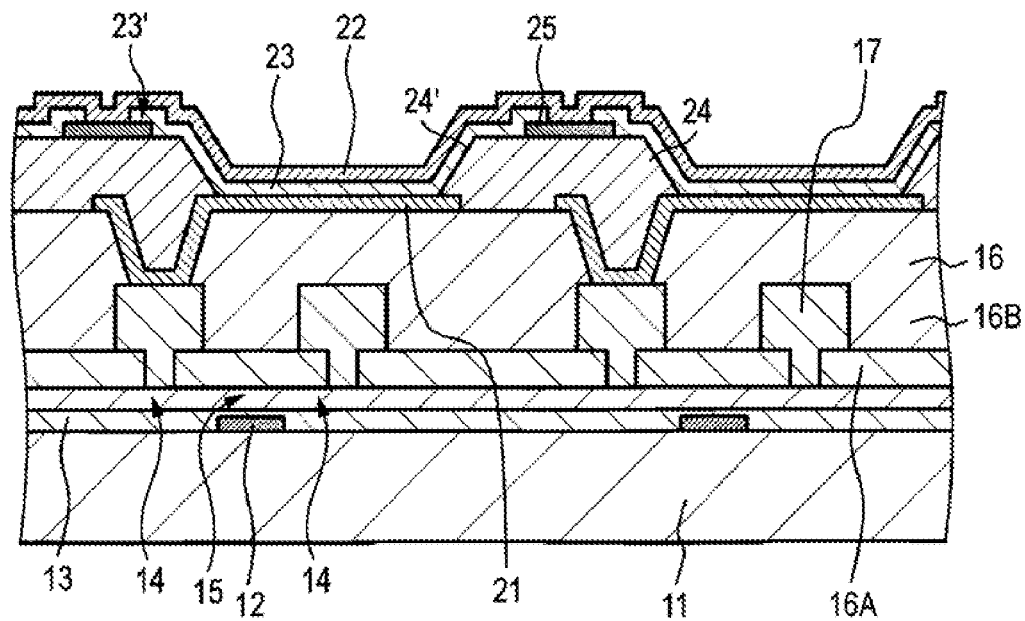

After that, the upper electrode 22 is formed on the whole surface of the display area (refer to FIG. 7B). The upper electrode 22 covers the whole surface of the stacked structures 23 and the auxiliary wiring 25 included in N×M organic EL elements. However, the upper electrode 22 is insulated from the lower electrode 21 by the stacked structure 23 and the insulating layer 24. The upper electrode 22 is formed based on the vacuum deposition process which is a deposition process in which energy of deposition particles is small to an extent not affecting the stacked structure 23. It is also preferable that an electron injection layer (for example, made of Lif having a thickness of 0.3 nm) for increasing an electron injection ability to the stacked structure 23 is formed between the stacked structure 23, the auxiliary wiring 25 and the upper electrode 22. In addition, the upper electrode 22 is sequentially formed in the same vacuum deposition apparatus as the formation of the stacked structure 23 without exposing the stacked structure 23 to air, thereby preventing deterioration of the stacked structures 23 due to moisture and oxygen in air. Specifically, Mg—Ag co-deposited film (volume ratio 10:1) is formed in a film thickness of 10 nm, thereby obtaining the upper electrode 22.

[Process-170]

Next, the insulating protection film 31 including silicon nitride ($Si_{1-x}N_x$) is formed on the upper electrode 22 based on the vacuum deposition process. The formation of the protection film 31 is performed sequentially in the same vacuum deposition apparatus as the formation of the upper electrode 22 without exposing the upper electrode 22 to air, thereby preventing deterioration of the stacked structures 23 due to moisture and oxygen in air. After that, the protection film 31 and the second substrate 33 are adhered by the adhesive layer 32 made of a UV cure adhesive. Lastly, the organic EL display device of Embodiment 1 can be completed by performing connection to external circuits.

In the organic EL display device in Embodiment 1, the auxiliary wiring 25 is provided, which can suppress the generation of voltage falling in the display area of the upper electrode 22 formed in a state of covering the whole surface of the display area even when the sheet resistance of the upper electrode 22 is high. As a result, it is possible to uniformize the light-emitting intensity of the organic EL elements in the display area. In addition, the portion at which the stacked structure 23 contacts the auxiliary wiring 25 (overlapping portion 23') is formed at the edge portions of the auxiliary wiring 25, that is, the upper electrode 22 does not directly touch the insulating layer 24, therefore, the upper electrode 22 can be prevented from being degenerated by the insulating layer 24. Therefore, it is possible to positively prevent problems such as lowering of image quality from occurring. The power consumption can be also reduced by proving the auxiliary wiring 25.

Figure 13:
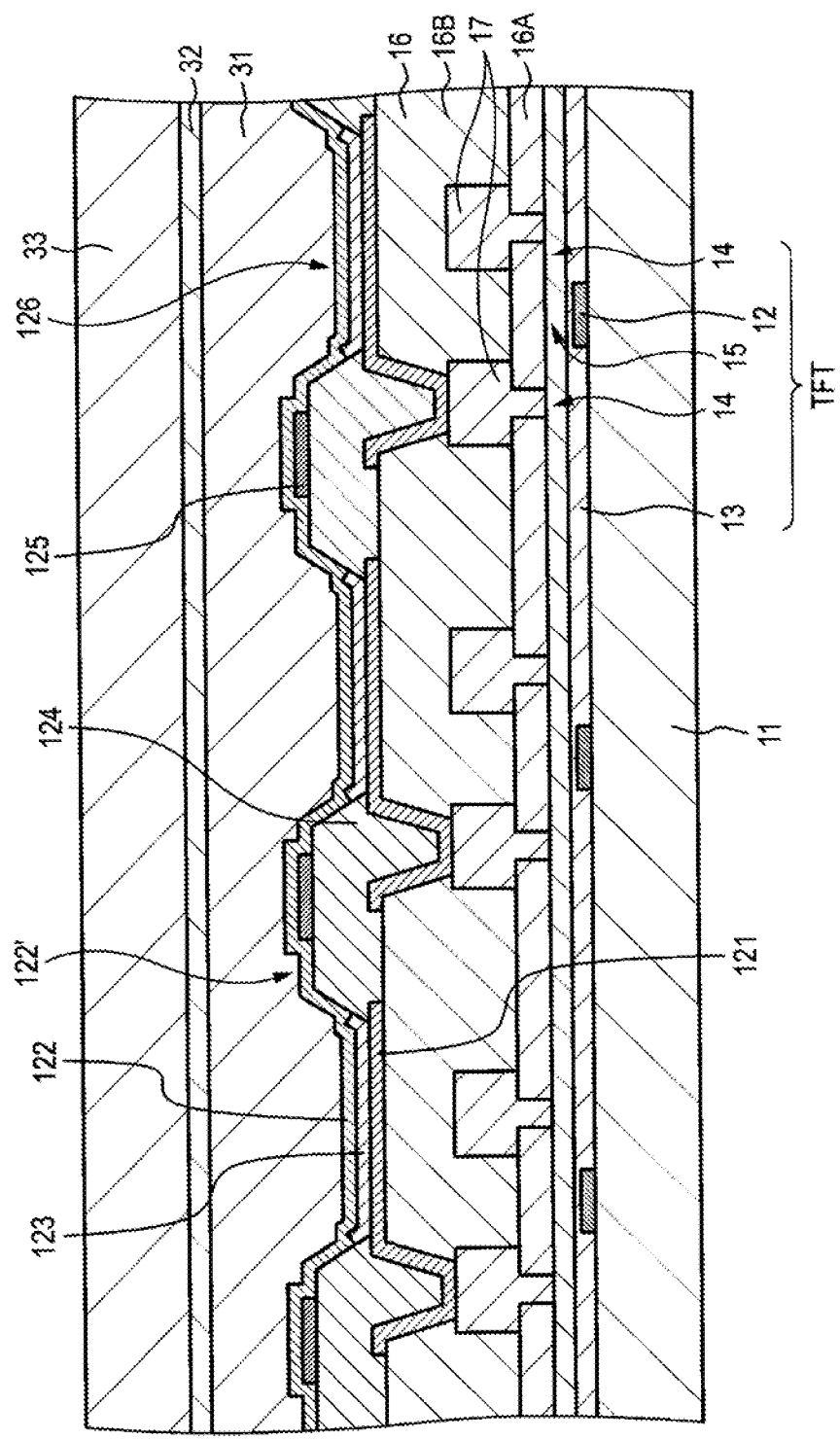
FIG. 13 is a schematic partial cross-sectional view of an organic electroluminescence display device of a related art.
Figure 14:
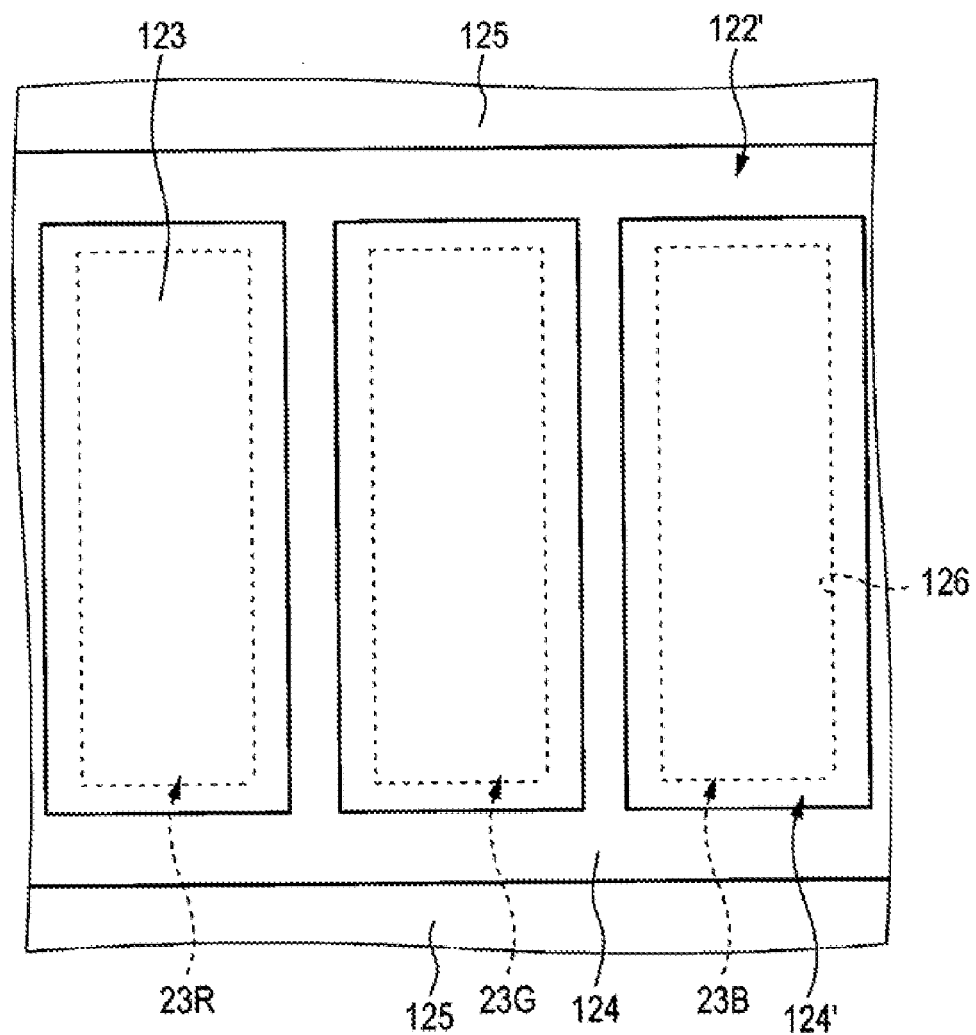
FIG. 14 is a partial plan view schematically showing arrangement of a stacked structure, an auxiliary wiring and an insulating layer and the like in the organic electroluminescence display device of the related art.

Specifically, in the organic EL display device in Embodiment 1, normal emission probability is 99.9%, and good emission characteristics can be obtained. On the other hand, as the schematic partial cross-sectional view is shown in FIG. 13 and the schematic partial plan view is shown in FIG. 14, the stacked structure 123 does not have a portion touching the auxiliary wiring 125, and the portion of the upper electrode 122 connecting the portion of the upper electrode 122 on the stacked structure 123 to the portion of the upper electrode 122 on the auxiliary wiring 125 is entirely formed on the insulating layer 124. When the organic EL display device having the structure and the configuration of the related art was fabricated as a comparative example and the normal emission probability was checked, the probability was 78.4% and the frequency at which the abnormality occurs was high. Such abnormal emission is caused by high resistance of the upper electrode 122 on the insulating layer 124 which has received chemical degeneration (alteration).

Embodiment 2

Figure 8:
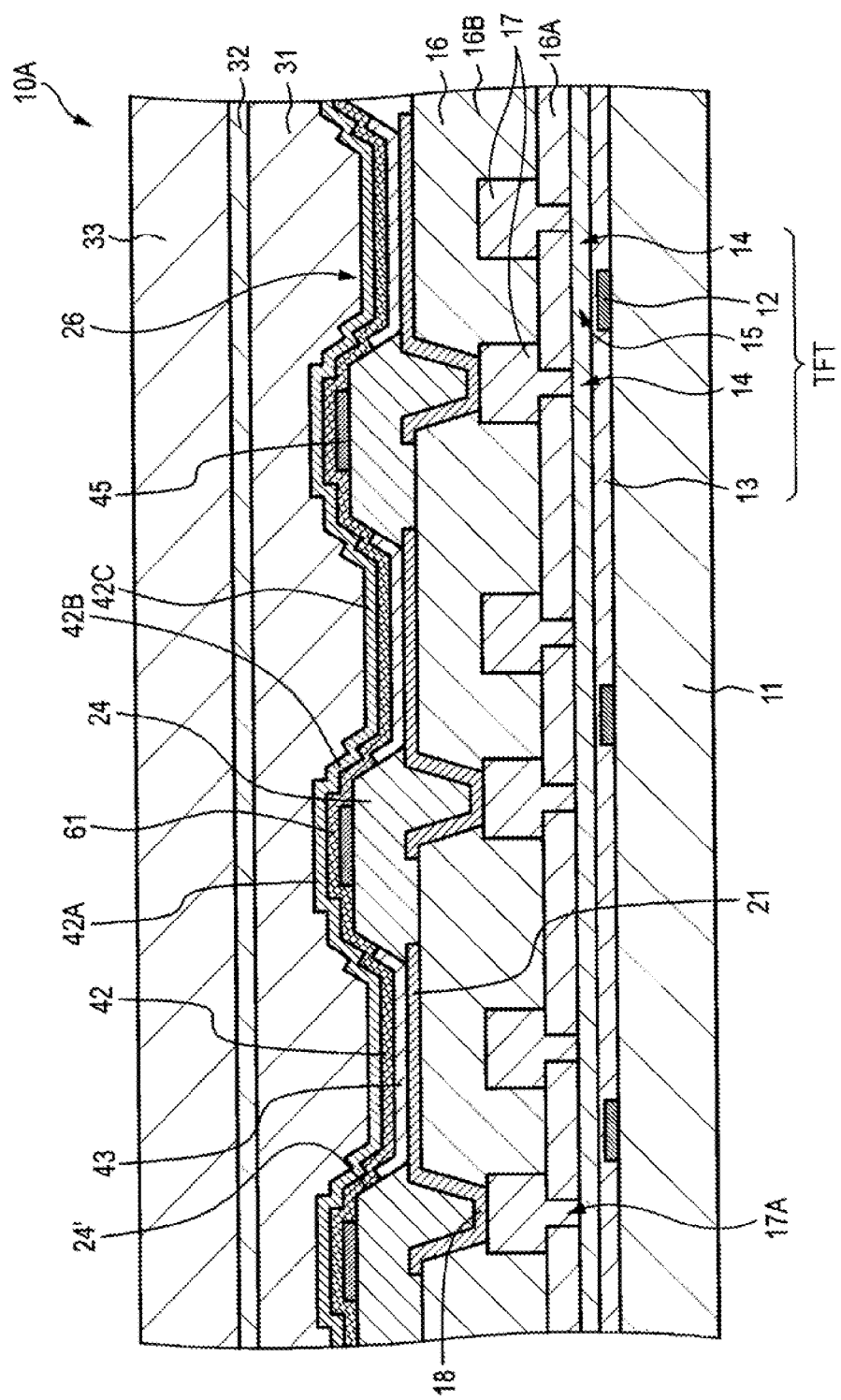
FIG. 8 is a schematic partial cross-sectional view of an organic electroluminescence display device according to Embodiment 2.

Embodiment 2 relates to an organic EL display device according to a second embodiment. A schematic partial cross-sectional view of the organic EL display device of Embodiment 2 is shown in FIG. 8.

In the organic EL display device of Embodiment 2, a portion 42A of an upper electrode 42 positioned over an auxiliary wiring 45 is electrically connected to the auxiliary wiring 45 through a two-layer structure layer 61 (shown in one layer in the drawing) including a charge injection layer and a charge transport layer from below. The insulating layer 24 and the auxiliary wiring 45 are provided in common to plural organic EL elements 10A, and the upper electrode 42 covers stacked structures 43 forming the plural organic EL elements 10A and the two-layer structure layer 61 without touching the insulating layer 24. In the organic EL display device of Embodiment 2, the lower electrode 21 is used as an anode electrode and the upper electrode 42 is used as a cathode electrode, therefore, the charge injection layer included in the two-layer structure layer 61 is formed by an electron injection layer, more specifically, Lif having a thickness of 0.3 nm, and the charge transport layer is formed by an electron transport layer, more particularly, Bathocuproine (BCP) having a thickness of 5 nm.

The two-layer structure layer 61 extends between a portion 42B of the upper electrode 42 and the insulating layer 24. The portion 42B is positioned between the portion 42A of the upper electrode 42 positioned over the auxiliary wiring 45 and a portion 42C of the upper electrode 42 which covers the stacked structure 43. Further, the two-layer structure layer 61 extends also between the portion of the stacked structure 43 positioned over the lower electrode 21 and the upper electrode 42. Specifically, the two-layer structure layer 61 and the upper electrode 42 formed thereover cover the whole surface of the stacked structures 43 forming the plural organic EL elements and the auxiliary wiring 45, further, the insulating layer 24.

An outline of a method of manufacturing the organic EL display device of Embodiment 2 will be explained with reference to FIG. 9A and FIG. 9B.

[Process-200]

First, the TFT is fabricated by each sub pixel on the first substrate 11 by the well-known method in the same manner as [Process-100] of Embodiment 1. Next, the wiring 17 is formed over the lower interlayer insulating layer 16A in the same manner as [Process-110] of Embodiment 1, depositing the upper interlayer insulating layer 16B including $SiO_2$ over the whole surface by the CVD process and forming the opening 18' on the upper interlayer insulating layer 16B based on the photolithography technique and the etching technique. After that, the lower electrode 21 including chromium is formed over the upper interlayer insulating layer 16B in the same manner as [Process-120] of Embodiment 1. Next, the insulating layer 24 having the opening 26, in which the lower electrode 21 is exposed at the bottom of the opening 26 is formed over the interlayer insulating layer 16 including the lower electrode 21 in the same manner as [Process-130] of Embodiment 1. After that, the auxiliary wiring 45 is formed on the insulating layer 24 in the same manner as [Process-140] of Embodiment 1. Accordingly, the same structure as shown in FIG. 6B can be obtained.

[Process-210]

Figure 9A:
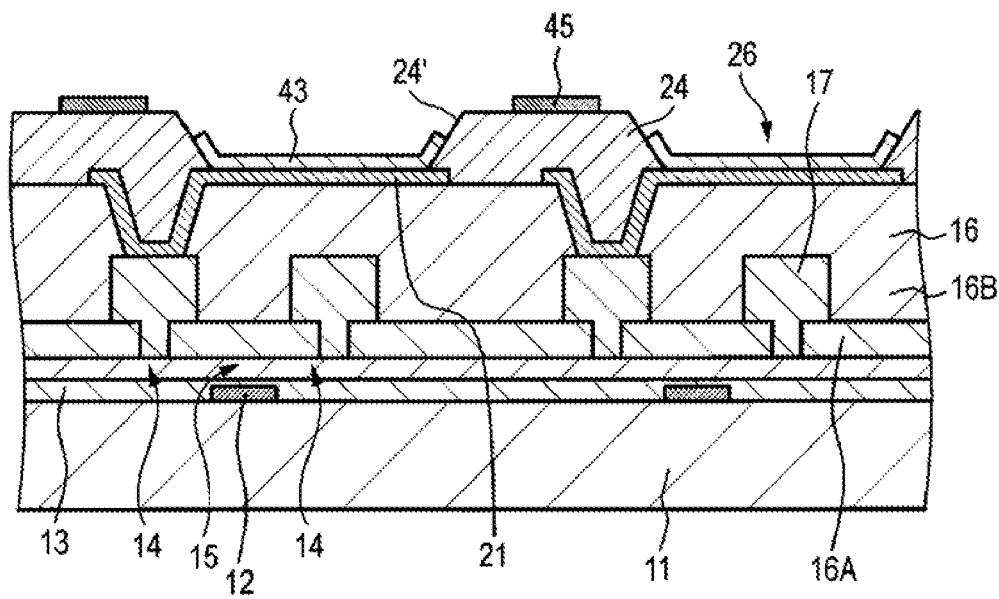
FIG. 9A and FIG. 9B are schematic partial cross-sectional views of the first substrate and the like for explaining an outline of a manufacturing method of the organic electroluminescence display device according to Embodiment 2.
Figure 9B:
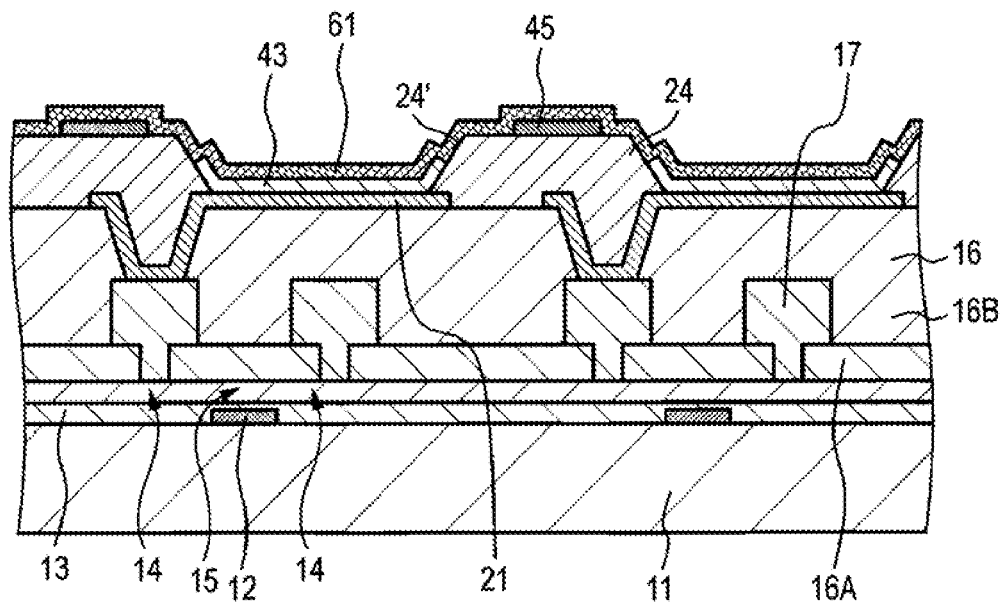

In substantially the same manner as [Process-150] of Embodiment 1, the stacked structure 43 is formed at a portion from the portion of the lower electrode 21 exposed at the bottom of the opening portion 26 to the portion 24' of the insulating layer 24 surrounding the opening 26 (refer to FIG. 9A). In the stacked structure 43, for example, the hole transport layer made of an organic material and the light-emitting layer doubling as the electron transport layer are sequentially stacked in the same manner as Embodiment 1. Or, in the stacked structure 43, the hole transport layer made of an organic material, the light-emitting layer and the electron transport layer are sequentially stacked. The stacked structure 43 is formed over the portion 24' of the insulating layer 24 surrounding the opening 26, however, it does not touch the auxiliary wiring 45, which is different from Embodiment 1.

Specifically, in the same manner as Embodiment 1, first, the plasma treatment is performed for removing organic extraneous matters and for improving hole injection ability of the surface of the lower electrode 21.

Next, the organic material is vacuum-deposited in a state in which the insulating layer 24 is used as a kind of spacer and a metal mask (not shown) for forming the stacked structure 43 which configures each sub pixel is placed at the protrusion (in which the auxiliary wiring 25 is provided) of the insulating layer 24 based on resistance heating. The organic material passes through an opening provided on the metal mask and is deposited from the portion over the lower electrode 21 exposed at the bottom of the opening 26 forming the sub pixel to the portion 24' of the insulating layer 24 surrounding the opening 26.

The structure of the stacked structure (organic layer) in the organic EL element forming the green light-emitting sub pixel, the structure of the stacked structure (organic layer) in the organic EL element forming the blue light-emitting sub pixel and the structure of the stacked structure (organic layer) in the organic EL element forming the red light-emitting sub pixel can be the same as Embodiment 1.

[Process-220]

After that, the two-layer structure layer 61 including the charge injection layer and the charge transport layer from below is formed on the whole surface of the display area by vacuum-depositing the organic material based on the resistance heating (refer to FIG. 9B). Since the two-layer structure layer 61 is to be formed on the whole surface, a mask or the like for forming the two-layer structure layer 61 is not necessary, which simplifies the manufacturing process as well as decreases the number of masks to be used. The two-layer structure layer 61 is formed based on the vacuum deposition process in which energy of deposition particles is small to an extent not affecting the stacked structure 43.

[Process-230]

After that, the upper electrode 42 is formed on the whole surface of the display area in the same manner as [Process-160] of Embodiment 1. The upper electrode 42 covers the whole surface the stacked structures 43 and the auxiliary wiring 45 forming N×M organic EL elements. It is also preferable that an electron injection layer (made of, for example, Lif having a thickness of 0.3 nm) for increasing the electron injection ability to the stacked structure 43.

[Process-240]

Subsequently, in the same manner as [Process-170] of Embodiment 1, the insulating protection film 31 including silicon nitride ($Si_{1-x}N_x$) is formed on the upper electrode 42 by the vacuum deposition process, then, the protection film 31 and the second substrate 33 are adhered by the adhesive layer 32 made of a UV cure adhesive. Lastly, the organic EL display device of Embodiment 2 can be completed by performing connection to external circuits.

The auxiliary wiring 45 and the upper electrode 42 are electrically connected through the two-layer structure layer 61, however, it is preferable that voltage falling is small as much as possible from a viewpoint suppressing power consumption and heat generation of the organic EL display device. Generally, the area of the electrical connection portion between the auxiliary wiring 45 and the upper electrode 42 (hereinafter, referred to as "contact portion") is approximately 1/100 to 1/1000 of the area of the electrical connection portion between the upper electrode 42 and the stacked structure 43, therefore, the current density of electric current flowing at the contact portion is approximately 100 times or 1000 times as much as the current density of electric current flowing at the electrical connection portion between the upper electrode 42 and the stacked structure 43. Even in such a condition, it is necessary to realize sufficient charge movement, specifically, it is preferable that voltage falling between the auxiliary wiring 45 and the upper electrode 42 is 5 V or less when the current density of electric current flowing between the auxiliary wiring 45 and the upper electrode 42 is 10 A/cm² or less at the contact portion.

In order to obtain the above condition, it is necessary that the charge transport layer (electron transport layer) included in the two-layer structure layer 61 has high electron mobility, in which electrons are easily injected to the upper electrode 42 from the auxiliary wiring 45 through the charge injection layer (electron injection layer). The electrons are injected from the upper electrode 42 to the stacked structure 43 through the two-layer structure layer 61, as a result, the stacked structure 43 emits light, therefore, it is preferable that the charge transport layer (electron transport layer) is made of an material which keeps characteristics of the organic EL element in good condition and is deposited by the deposition method in which characteristics of the organic EL element can be kept in good condition. Specifically, electron transport materials such as Bathocuproine (BCP), Bathophenanthroline and Anthracene can be cited.

In Embodiment 2, the charge transport layer (specifically, electron transport layer) included in the two-layer structure layer 61 is made of Bathocuproine (BCP), therefore, the rise of drive voltage necessary for achieving the same luminance is suppressed to approximately 2.5 V as compared with the organic EL display device of the above comparative example.

Also in the organic EL display device of Embodiment 2, the auxiliary wiring 45 is provided, in addition, the auxiliary wiring 45 and the upper electrode 42 are electrically connected through the two-layer structure layer 61, therefore, occurrence of voltage falling in the display area of the upper electrode 42 formed in a state of covering the whole surface of the display area can be suppressed, even when the sheet resistance of the upper electrode 42 is high. As a result, it is possible to uniformize the light emitting intensity of the organic EL elements in the display area. In addition, the two-layer structure layer 61 exists between the insulating layer 24 and the upper electrode 42, and the upper electrode 42 does not directly touch the insulating layer 24, which can positively suppress the upper electrode 42 to be degenerated by the insulating layer 24. Therefore, it is possible to reliably prevent occurrence of problems such as occurrence of deterioration of image quality. It is also possible to reduce the power consumption by proving the auxiliary wiring 45.

Figure 10A:
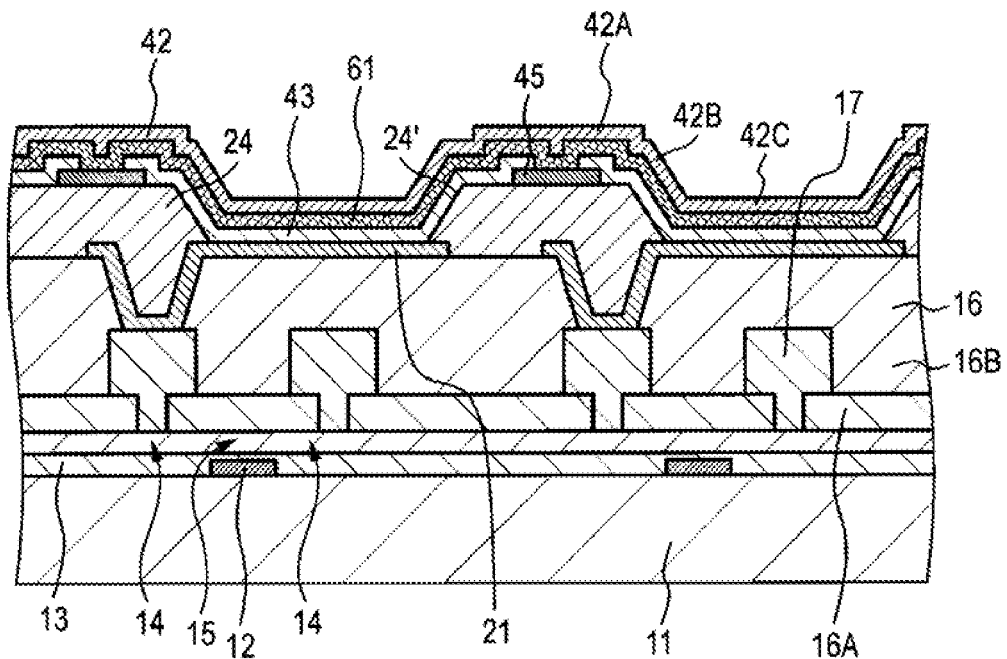
FIG. 10A and FIG. 10B are schematic partial cross-sectional views of a modification example of the organic electroluminescence display device according to Embodiment 2.
Figure 10B:
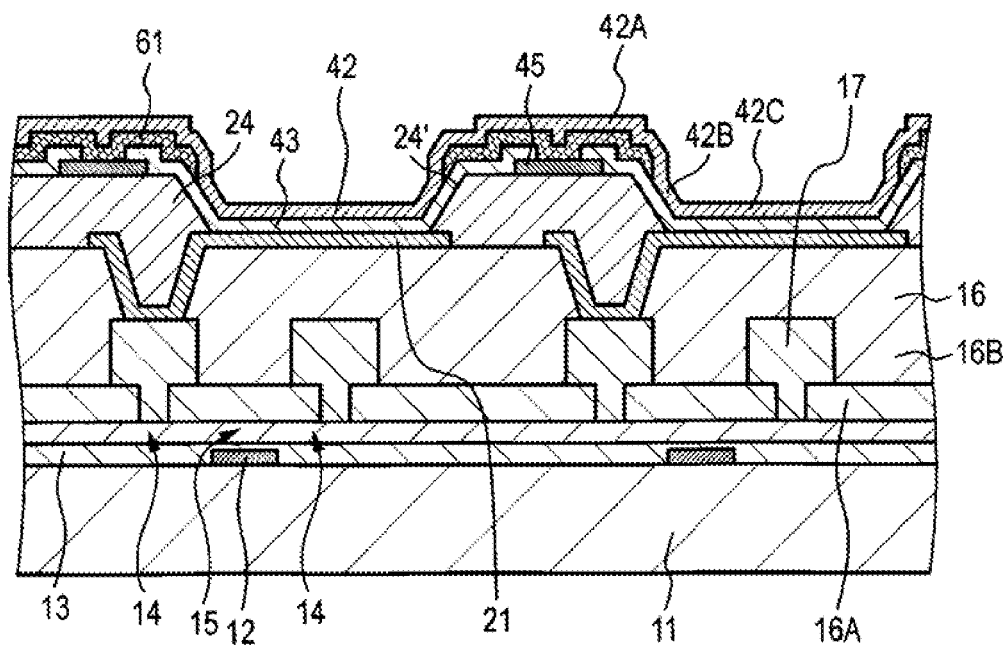

The configuration and the structure of the two-layer structure layer 61 are not limited to the configuration and the structure shown in FIG. 8. As shown in FIG. 10A, it is preferable that at least one layer of the stacked structure 43 (in the shown example, all plural layers forming the stacked structure 43) may extend between the portion 42B of the upper electrode 42 and the insulating layer 24. The portion 42B is positioned between the portion 42A of the upper electrode 42 positioned over the auxiliary wiring 45 and a portion 42C of the upper electrode 42 which covers the stacked structure 43. In the shown example, the stacked structure 43 includes portions touching the auxiliary wiring 45 (portions overlapping with edge portions of the auxiliary wiring 45). The example shown in FIG. 10B is different from the example shown in FIG. 10A in a point in which the two-layer structure layer 61 is formed only at the auxiliary wiring 45 and in the vicinity thereof. That is to say, the stacked structure 43 is formed between the portion 24' of the insulating layer 24 and the upper electrode 42, and the upper electrode 42 does not directly touch the insulating layer 24. In the above examples, it is also preferable that the stacked structure 43 is formed after the two-layer structure layer 61 is formed though not shown, and in such case, the stacked layer 43 is formed over the two-layer structure layer 61.

Certain preferred embodiments have been explained. However, the present application is not limited to these embodiments. The configuration and the structure of the organic EL display device or the organic EL display element in the embodiments and materials forming the organic EL display device or the organic EL display element have been explained as examples, which can be suitably changed.

In the embodiments, a kind of protrusion is provided at the edge portion of the auxiliary wiring 25, and the overlapping portion 23' of the stacked structure is provided on the protrusion, however, it is also preferable that an overlapping portion of the stacked structures is provided on a liner-line edge portion of the auxiliary wiring, extending the whole length direction of the auxiliary wiring. It is also preferable that the auxiliary wiring is formed so as to surround all four sides of one sub pixel and that an overlapping portion of the stacked structure is provided over the whole edge portions of the auxiliary wiring formed so as to surround the four sides of one sub pixel. In addition, it is preferable that the stacked structure contacts one auxiliary wiring in some cases. In the embodiments, the insulating layer 24 has a shape including protrusions, however, the shape of the insulating layer 24 is not limited to the shape, and it is also preferable to apply a configuration in which the top face of the insulating layer 24 is in the same level as the top face of the stacked structure 23.

Figure 11A:
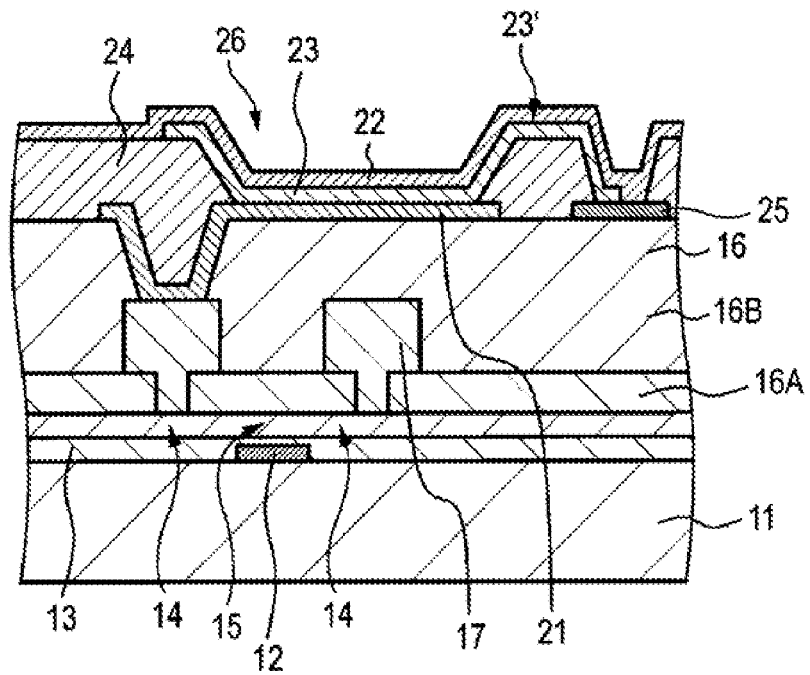
FIG. 11A and FIG. 11B are schematic partial cross-sectional views of a modification the organic electroluminescence display device according to Embodiment 1.
Figure 11B:
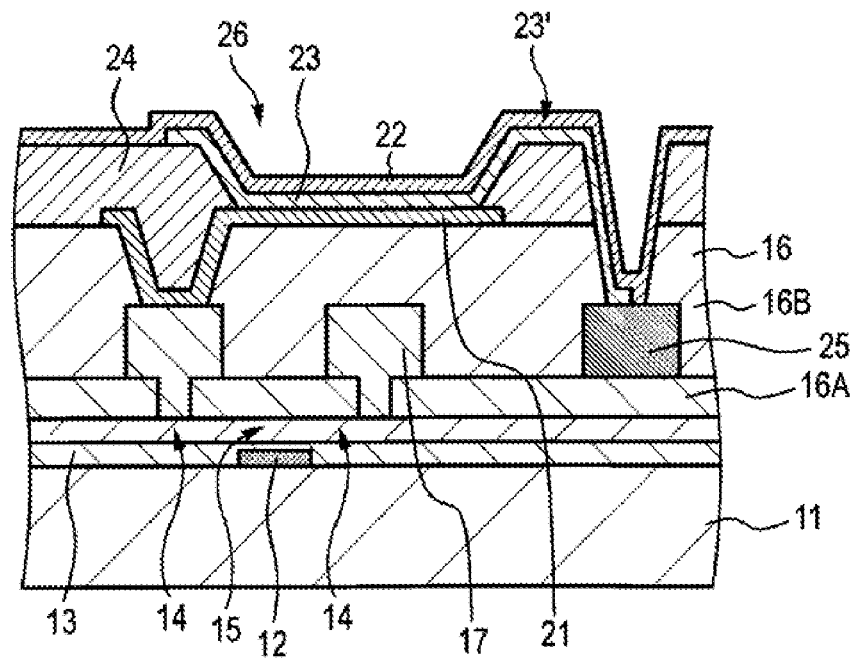

Through the auxiliary wiring 25, 45 is formed on the insulating layer 24 in the embodiments, it is also preferable that the auxiliary wiring 25, 45 is provided on the interlayer insulating layer 16 when the lower electrode 21 is provided, an opening is provided at the insulating layer 24 over the auxiliary wiring 25, 45 and the stacked structure 23, 43 extends from a portion over the insulating layer 24 to the auxiliary wiring 25, 45 (refer to a schematic partial cross-sectional view of FIG. 11A). Or, it is preferable that the auxiliary wiring 25, 45 is provided when the formation of the wiring 17 at the same time (refer to schematic partial cross-sectional view in FIG. 11B). The configuration and the structure in these modifications can be applied to the organic EL display device explained in the modification of Embodiment 2.

The organic EL display device may be a transmissive type. In case that the lower electrode is used as an anode electrode, it is preferable that the lower electrode is made of a conductive material whose value of a work function is large as well as whose light transmittance is high such as ITO or IZO. On the other hand, in case that the lower electrode is used an a cathode electrode, it is preferable that the lower electrode is made of a conductive material whose value of the work function is small as well as whose light transmittance is high. Furthermore, in case that the upper electrode is used as a cathode electrode, it is preferable that the upper electrode is made of a conductive material whose value of the work function is small as well as whose light reflectance is high. On the other hand, in case that the upper electrode is used as an anode electrode, it is preferable that the upper electrode is made of a conductive material whose value of the work function is large as well as whose light reflectance is high.

Though the stacked structure is formed at each sub pixel in Embodiment 1, it is possible that the stacked structure is formed at each region prescribing the sub pixel with respect to red light-emitting sub pixels emitting red and the green light-emitting sub pixels emitting green, and the stacked structure emitting blue is formed at the whole surface of the display area with respect to blue light emitting sub pixels emitting blue. The upper electrode is formed over the stacked structure emitting blue so as to cover the whole surface of the stacked structure emitting blue. In this case, the red light-emitting sub pixel has a stacked state of a stacked structure emitting red and a stacked structure emitting blue, however, the sub pixel emits red when electric current flows between the lower electrode and the upper electrode. Similarly, the green light-emitting sub pixel has a stacked state of a stacked structure emitting green and a stacked structure emitting blue, however, the sub pixel emits green when electric current flows between the lower electrode and the upper electrode. In the organic EL display device having the above configuration, a connecting portion (connecting terminal portion or wiring for connection) for connecting the upper electrode formed on the whole surface to the outside is formed on an interlayer insulating layer at the periphery of the organic EL display device. Even in such configuration, in order to suppress degeneration of the upper electrode by the insulating layer in the region in which the upper electrode is connected to the connecting portion, it is preferable that the stacked structure emitting blue is interposed between the upper electrode and the insulating layer. That is, the region in which the upper electrode is connected to the connecting portion has a stacked state of the interlayer insulating layer, the insulating layer, the stacked structure emitting blue and the upper electrode. A part of the connecting portion has a stacked state of the interlayer insulating layer, the connecting portion, the stacked structure emitting blue and the upper electrode. The other portions in the connecting portion have a stacked state of the interlayer insulating layer, the connecting portion and the upper electrode.

Figure 12:
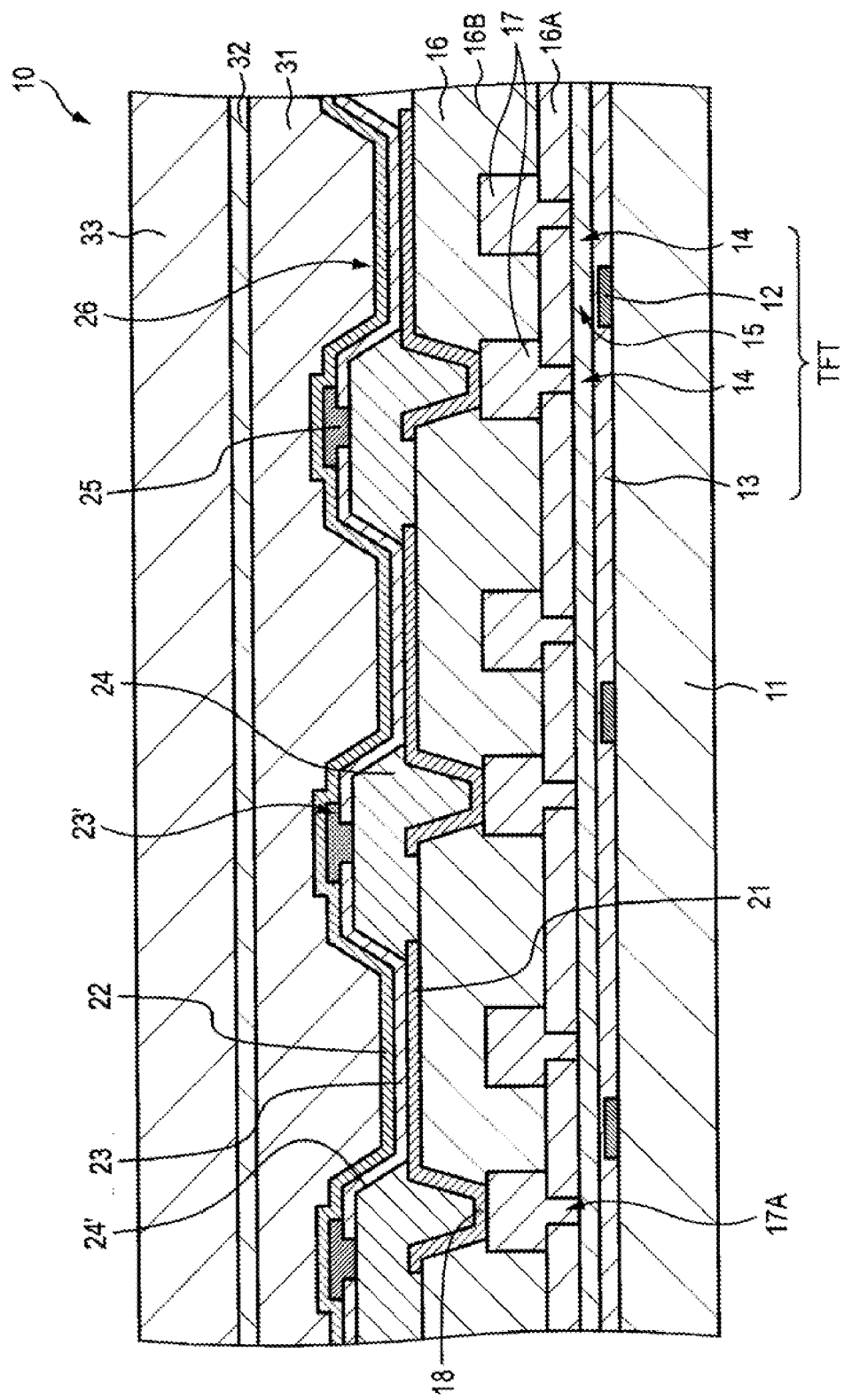
FIG. 12 is a schematic partial cross-sectional view of an organic electroluminescence display device showing a modification of a structure of an overlapping portion over a part of the insulating layer.

In the embodiments, the overlapping portion 23' on a part of the insulating layer 24 has a stacked state in which the auxiliary wiring 25, the stacked structure 23, and the upper electrode 22 are sequentially stacked, however, in some cases, it may be alternatively a stacked state in which the stacked structure 23, the auxiliary wiring 25 and the upper electrode 22 are sequentially stacked from below on a part of the insulating layer 24 as shown in the schematic partial cross-sectional view in FIG. 12. The configuration and the structure shown in FIG. 12 can be applied to the organic EL display device explained in the second embodiment or the modifications.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. An organic electroluminescence display device comprising:
    (a) a lower electrode;
    (b) an insulating layer having an opening, in which a lower electrode is exposed at a bottom of the opening;
    (c) an auxiliary wiring;
    (d) a stacked structure provided from a portion over the lower electrode exposed at the bottom of the opening to a portion of the insulating layer surrounding the opening, including a light emitting layer made of an organic light-emitting material; and
    (e) an upper electrode; and
    (f) a protection film provided on the upper electrode and capable of transmitting more than 80% of light generated in the stacked structure,
    wherein a portion of the upper electrode positioned over the auxiliary wiring is electrically connected to the auxiliary wiring through a two-layer structure layer including a charge injection layer and a charge transport layer, and
    wherein the upper electrode covers the stacked structures and the two-layer structure layer forming the plurality of organic electroluminescence elements without touching the insulating layer, and
    wherein the upper electrode partially contacts the stacked structure, partially contacts the auxiliary wiring, and partially contacts the two-layer structure layer.

2. The organic electroluminescence display device according to claim 1, wherein the two-layer structure layer extends also between the stacked structure positioned over the lower electrode and the upper electrode.

3. The organic electroluminescence display device according to claim 1, wherein at least one layer of the stacked structure has a portion connected to the auxiliary wiring.

4. The organic electroluminescence display device according to claim 1,
    wherein voltage falling between the auxiliary wiring and the upper electrode is equal to or less than 5 V when the current density of electric current flowing between the auxiliary wiring and the upper electrode is equal to or less than 10 A/cm$^2$.

5. The organic electroluminescence display device according to claim 1, wherein the upper electrode is made of a conductive material including magnesium and the thickness of the upper electrode ranges from 4 nm to 20 nm.

6. The organic electroluminescence display device according to claim 1,
    wherein the protection film is made of a material selected from the group consisting of inorganic-amorphous insulating materials such as amorphous silicon ($\alpha$-Si), amorphous silicon carbide ($\alpha$-SiC), amorphous silicon nitride ($\alpha$-Si$_{1-x}$—N$_x$), amorphous silicon oxide ($\alpha$-Si$_{1-y}$O$_y$), and amorphous carbon ($\alpha$-C).

7. The organic electroluminescence display device according to claim 1,
    wherein the auxiliary wiring is made of a conductive material selected from the group consisting of aluminum, silver, nickel, copper, chromium, tungsten, niobium, tantalum, molybdenum, gold, titanium, cobalt, zirconium, iron, platinum, zinc, and alloys including the above metal elements.

8. The organic electroluminescence display device according to claim 1,
    wherein the lower electrode is made of a material selected from the group consisting of chromium, iron, cobalt, nickel, copper, tantalum, tungsten, platinum and gold.

* * * * *